United States Patent
Park et al.

(10) Patent No.: US 10,770,663 B2
(45) Date of Patent: Sep. 8, 2020

(54) GERMANIUM-CENTERED DENDRIMER COMPOUND, AND ORGANIC OPTOELECTRIC ELEMENT COMPRISING SAME

(71) Applicant: Chung-Ang University Industry—Academic Cooperation Foundation, Seoul (KR)

(72) Inventors: Kwang Yong Park, Seoul (KR); Ho Jun Shon, Gyeonggi-do (KR); Tae Won Lee, Incheon (KR)

(73) Assignee: Chung-Ang University Industry-Academic Cooperation Foundation, Seoul (KR)

( * ) Notice: Subject to any disclaimer, the term of this patent is extended or adjusted under 35 U.S.C. 154(b) by 300 days.

(21) Appl. No.: 14/904,109

(22) PCT Filed: Jul. 9, 2014

(86) PCT No.: PCT/KR2014/006171
§ 371 (c)(1),
(2) Date: Jan. 11, 2016

(87) PCT Pub. No.: WO2015/005680
PCT Pub. Date: Jan. 15, 2015

(65) Prior Publication Data
US 2016/0141520 A1    May 19, 2016

(30) Foreign Application Priority Data
Jul. 9, 2013    (KR) .................. 10-2013-0080512

(51) Int. Cl.
*H01L 51/00* (2006.01)
*C07F 7/30* (2006.01)
(Continued)

(52) U.S. Cl.
CPC ............ *H01L 51/0077* (2013.01); *C07F 7/30* (2013.01); *C09K 11/06* (2013.01);
(Continued)

(58) Field of Classification Search
CPC ............ H01L 51/0077; H01L 51/0072; H01L 51/0058; H01L 51/0059; H01L 51/5012;
(Continued)

(56) References Cited

U.S. PATENT DOCUMENTS 3,109,851 A * 11/1963 Ramsden .................. C07F 3/12
260/665 B
2003/0220520 A1* 11/2003 Marcuccio .............. C07F 5/025
562/7

(Continued)

FOREIGN PATENT DOCUMENTS

JP    2007-108309    4/2007
KR    10-0522697    10/2005
(Continued)

OTHER PUBLICATIONS

Stephanie D. Warner "Pressure-tuning infrared and Raman spectroscopy of Group 14 tetraphenyl compounds" Spectrochimica Acta Part A 56 (2000) 453-466.*

(Continued)

*Primary Examiner* — Michael Y Sun

(57) ABSTRACT

Germanium-centered dendrimer compounds and organic optoelectronic devices comprising the same are provided. The organic optoelectronic device comprising the compound is capable of implementing high light-emitting ability and light-emitting efficiency, and improving thermal stability (heat resistance) of the organic optoelectronic devices, thereby increasing the lifetime thereof.

6 Claims, 1 Drawing Sheet

(51) Int. Cl.
  *C09K 11/06*   (2006.01)
  *H01L 51/50*   (2006.01)
  *H01L 51/42*   (2006.01)
  *C07F 7/24*    (2006.01)
  *C07F 7/22*    (2006.01)
  *C07F 7/02*    (2006.01)

(52) U.S. Cl.
  CPC ...... *H01L 51/0058* (2013.01); *H01L 51/0059* (2013.01); *H01L 51/0072* (2013.01); *C07F 7/02* (2013.01); *C07F 7/22* (2013.01); *C07F 7/24* (2013.01); *C09K 2211/1007* (2013.01); *C09K 2211/1011* (2013.01); *C09K 2211/1014* (2013.01); *C09K 2211/1029* (2013.01); *C09K 2211/1088* (2013.01); *C09K 2211/188* (2013.01); *H01L 51/424* (2013.01); *H01L 51/5012* (2013.01); *H01L 2224/051* (2013.01); *H01L 2924/01032* (2013.01); *H01L 2924/10252* (2013.01); *Y02E 10/549* (2013.01)

(58) Field of Classification Search
  CPC ......... H01L 51/424; H01L 2924/10252; H01L 2224/051; H01L 2924/01032; H01L 51/0065; H01L 51/0067; H01L 51/0068; C07F 7/30; C07F 7/24; C07F 7/22; C07F 7/02; C09K 11/06; C09K 2211/188; C09K 2211/1014; C09K 2211/1029; C09K 2211/1011; C09K 2211/1088; C09K 2211/1007; Y02E 10/549

See application file for complete search history.

(56) References Cited

U.S. PATENT DOCUMENTS

2011/0254436 A1*  10/2011  Cheng ................ C07C 15/20
                                                  313/504
2014/0159027 A1*  6/2014  Shin ................. C09K 11/06
                                                  257/40

FOREIGN PATENT DOCUMENTS

| KR | 10-2013-0054169 | 5/2013 | |
|----|-----------------|--------|--|
| WO | WO-2012096538 A2 * | 7/2012 | ......... H01L 51/0058 |
| WO | WO 2013/009141 | 1/2013 | |
| WO | WO 2015/005680 | 1/2015 | |

OTHER PUBLICATIONS

Teng Ben "Gas storage in porous aromatic frameworks (PAFs)" Cite this: Energy Environ. Sci., 2011, 4, 3991.*

Zujin Zhao "Luminescent tetraphenylethene-substituted silanes" Pure Appl. Chem., vol. 82, No. 4, pp. 863-870, 2010.*

International Search Report and the Written Opinion dated Sep. 24, 2014 From the Korean Intellectual Property Office Re. Application No. PCT/KR2014/006171 and Its Translation Into English.

* cited by examiner

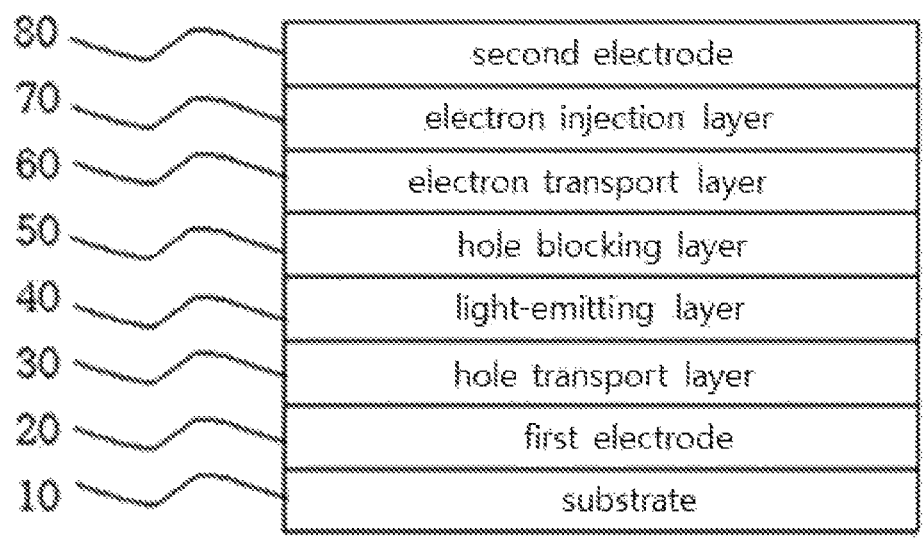

GERMANIUM-CENTERED DENDRIMER COMPOUND, AND ORGANIC OPTOELECTRIC ELEMENT COMPRISING SAME

RELATED APPLICATIONS

This application is a National Phase of PCT Patent Application No. PCT/KR2014/006171 having International filing date of Jul. 9, 2014, which claims the benefit of priority of Korean Patent Application No. 10-2013-0080512 filed on Jul. 9, 2013. The contents of the above applications are all incorporated by reference as if fully set forth herein in their entirety.

FIELD AND BACKGROUND OF THE INVENTION

The present invention relates to a germanium-centered dendrimer compound, and an optoelectronic device including the same, and more particularly, to a compound for an optoelectronic device, an optoelectronic device including the same and an electronic device.

Recently, an organic compound having a low band gap is applied to various types of optoelectronic devices. An organic optoelectronic material is cheap, and optoelectronic properties of the material are easily controlled by changing a compound structure. The organic compounds used as an organic optoelectronic material may be classified into small molecules, oligomers, dendrimers and polymers according to a size and a shape.

Generally, the organic compounds used as an organic optoelectronic material are π-conjugated materials, and HOMO and LUMO levels and optoelectronic properties may be controlled by controlling a conjugation length or introducing an electron donating or withdrawing substituent. Also, the organic compound is easily applied to a flexible substrate, and thus it is possible to achieve mass-production and reduce a cost through a roll-to-roll process.

Generally, the optoelectronic device includes two electrodes facing each other and a light-emitting layer interposed between the electrodes and containing a light-emitting compound. When a current is supplied between the electrodes, the light-emitting compound generates light. A display device using the optoelectronic device may reduce a weight, size or thickness of the display device without a separate light source. Also, the display device using the optoelectronic device has excellent viewing angle, contrast ratio and color reproducibility, and low consumption power, compared to a display device using a backlight and liquid crystals.

The optoelectronic device may further include a hole transport layer disposed between a positive electrode and the light-emitting layer. The hole transport layer may stabilize an interface between the positive electrode and the light-emitting layer, and minimize an energy barrier between them.

However, the optoelectronic device still has a short light-emitting lifetime, low power efficiency, and low thermal stability (thermal resistance). To solve these problems, various compounds are being developed as a material for an optoelectronic device, but there is a limit to manufacturing an optoelectronic device satisfying all of the light-emitting lifetime, power efficiency and thermal stability.

PRIOR ART DOCUMENT

Patent Document

Korean Unexamined Patent Application No. 2013-0054169

SUMMARY OF THE INVENTION

Technical Problem

The present invention is directed to providing a germanium-centered dendrimer compound, and an optoelectronic device including the same.

Technical Solution

The present invention may provide a germanium-centered dendrimer compound. In one example, the present invention may include a germanium-centered dendrimer compound having the following structure of Formula 1:

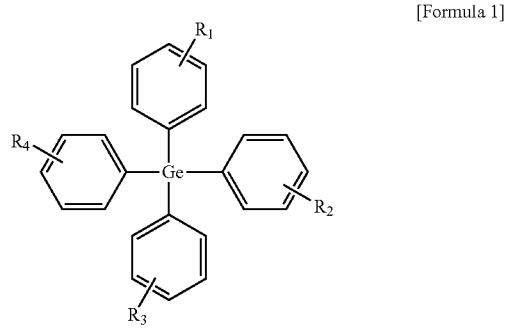

[Formula 1]

In Formula 1, $R_1$, $R_2$, $R_3$ and $R_4$ are each independently hydrogen, an alkyl group having 1 to 30 carbon atoms, an alkenyl group having 1 to 30 carbon atoms, an alkoxy group having 1 to 30 carbon atoms, an acyl group having 1 to 30 carbon atoms, an aryl group having 6 to 30 carbon atoms, a heteroaryl group having 2 to 30 carbon atoms, a heterocyclic group having 3 to 30 carbon atoms, a halogen group, or any one of Formulas 2 to 6,

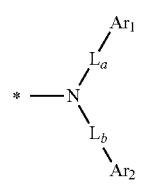

[Formula 2]

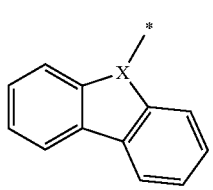

[Formula 3]

-continued

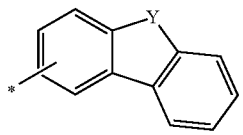
[Formula 4]

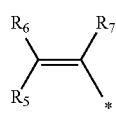
[Formula 5]

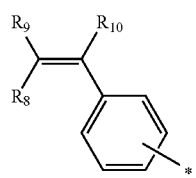
[Formula 6]

In Formulas 2 to 6,

X is C—($R_{11}$) or N,

Y is C—($R_{12}$)$_2$, N-$L_c$-$Ar_3$, O or S, $R_5$ to $R_{12}$ are each independently hydrogen, an alkyl group having 1 to 10 carbon atoms, an aryl group having 6 to 20 carbon atoms or a heteroaryl group having 2 to 20 carbon atoms, $L_a$, $L_b$, and $L_c$ are each independently an alkylene group having 1 to 10 carbon atoms or an arylene group having 6 to 20 carbon atoms, $Ar_1$, $Ar_2$, and $Ar_3$ are each independently hydrogen, an alkyl group having 1 to 20 carbon atoms, an aryl group having 6 to 20 carbon atoms, a heteroaryl group having 2 to 20 carbon atoms or an amine group, and at least one of hydrogens in $R_1$ to $R_{12}$, $L_a$ to $L_c$ and $Ar_1$ to $Ar_3$ are each independently substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

Also, the present invention may provide an optoelectronic device including the compound according to the present invention.

Effect of the Invention

An optoelectronic device including a germanium-centered dendrimer compound according to the present invention can have high light-emitting capability and light-emitting efficiency, and improve the thermal stability (thermal resistance) of the optoelectronic device to increase a lifetime.

BRIEF DESCRIPTION OF THE SEVERAL VIEWS OF THE DRAWINGS

FIG. 1 is a cross-sectional view of an optoelectronic device according to an exemplary embodiment of the present invention.

DESCRIPTION OF SPECIFIC EMBODIMENTS OF THE INVENTION

The present invention relates to a germanium-centered dendrimer compound, an optoelectronic device including the same and an electronic device, and as an example of the germanium-centered dendrimer compound, the present invention may provide a germanium-centered dendrimer compound having the structure of Formula 1:

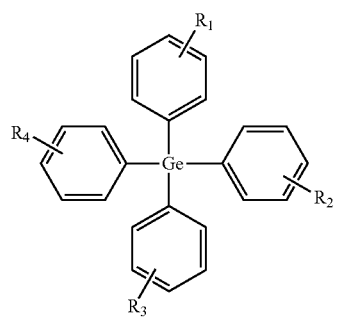
[Formula 1]

In Formula 1, $R_1$, $R_2$, $R_3$ and $R_4$ are each independently hydrogen, an alkyl group having 1 to 30 carbon atoms, an alkenyl group having 1 to 30 carbon atoms, an alkoxy group having 1 to 30 carbon atoms, an acyl group having 1 to 30 carbon atoms, an aryl group having 6 to 30 carbon atoms, a heteroaryl group having 2 to 30 carbon atoms, a heterocyclic group having 3 to 30 carbon atoms, a halogen group, or any one of Formulas 2 to 6.

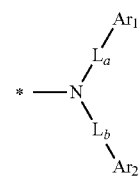
[Formula 2]

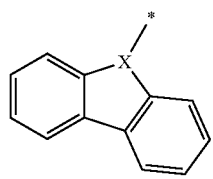
[Formula 3]

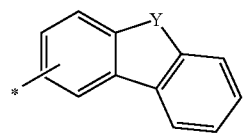
[Formula 4]

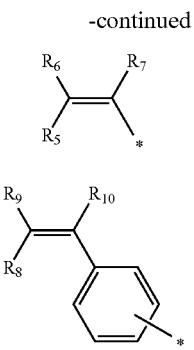

[Formula 5]

[Formula 6]

In Formulas 2 to 6,

X is C—($R_{11}$) or N,

Y is C—($R_{12}$)$_2$, N-$L_c$-$Ar_3$, O or S, $R_5$ to $R_{12}$ are each independently hydrogen, an alkyl group having 1 to 10 carbon atoms, an aryl group having 6 to 20 carbon atoms or a heteroaryl group having 2 to 20 carbon atoms, $L_a$, $L_b$, and $L_c$ are each independently an alkylene group having 1 to 10 carbon atoms or an arylene group having 6 to 20 carbon atoms, $Ar_1$, $Ar_2$, and $Ar_3$ are each independently hydrogen, an alkyl group having 1 to 20 carbon atoms, an aryl group having 6 to 20 carbon atoms, a heteroaryl group having 2 to 20 carbon atoms or an amine group, and at least one of hydrogens in $R_1$ to $R_{12}$, $L_a$ to $L_c$ and $Ar_1$ to $Ar_3$ are each independently substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

The term "aryl group" used herein may be, for example, a phenyl group, a naphthyl group, an anthracenyl group, a phenanathryl group, a naphthacenyl group, a pyrenyl group, a tolyl group, a biphenylyl group, a terphenylyl group, a chrycenyl group, a spirobifluorenyl group, a fluoranthenyl group, a fluorenyl group, a perylenyl group, an indenyl group, an azulenyl group, a heptalenyl group, a phenalenyl group, or a phenanthrenyl group.

Also, the term "heteroaryl group" used herein refers to a "heterocyclic aromatic" or "heterocyclic" derived from a monocyclic or condensed ring. The heteroaryl group may include at least one, for example, 1, 2, 3 or 4 heteroatoms such as nitrogen (N), sulfur (S), oxygen (O), phosphorus (P), selenium (Se) and silicon (Si). Specifically, the heteroaryl group may be a nitrogen-containing heteroaryl group such as a pyrrolyl group, a pyridyl group, a pyridazinyl group, a pyrimidinyl group, a pyrazinyl group, a triazolyl group, a tetrazolyl group, a benzotriazolyl group, pyrazolyl group, an imidazolyl group, a benzimidazolyl group, an indolyl group, an isoindolyl group, an indolizinyl group, a furinyl group, an indazolyl group, a quinolyl group, an isoquinolinyl group, a quinolinyl group, a phthalazinyl group, a naphthylidinyl group, a quinoxalinyl group, a quinazolinyl group, a cinnolinyl group, a phtheridinyl group, an imidazotriazinyl group, a pyrazinopyridazinyl group, an acrydinyl group, a phenanthridinyl group, a carbazolyl group, a carbazolynyl group, a pyrimidinyl group, a phenanthrolinyl group, a phenacinyl group, an imidazopyridinyl group, an imidazopyrimidinyl group, a pyrazolepyridinyl group, or a pyrazolopyridinyl group; a sulfur-containing heteroaryl group such as a thienyl group, a benzothienyl group, or a dibenzothienyl group; or an oxygen-containing heteroaryl group such as such as a furyl group, a pyranyl group, a cyclopentapyranyl group, a benzofuranyl group, an isobenzofuranyl group, or a dibenzofuranyl group. Also, specifically, the heteroaryl group may be a compound including at least two heteroatoms such as a thiazolyl group, an isothiazolyl group, a benzothiazolyl group, a benzthiadiazolyl group, a phenothiazinyl group, an isoxazolyl group, a furazanyl group, a phenoxazinyl group, an oxazolyl group, a benzoxazolyl group, an oxadiazolyl group, a pyrazoloxazolyl group, an imidazothiazolyl group, a thienofuranyl group, a furopyrrolyl group, or a pyridoxazinyl group.

Also, the term "alkyl group" is defined as a functional group derived from a linear or branched saturated hydrocarbon. Specifically, the alkyl group may be a methyl group, an ethyl group, an n-propyl group, an isopropyl group, an n-butyl group, a sec-butyl group, a tert-butyl group, an n-pentyl group, a 1,1-dimethylpropyl group, a 1,2-dimethylpropyl group, a 2,2-dimethylpropyl group, a 1-ethylpropyl group, a 2-ethylpropyl group, an n-hexyl group, a 1-methyl-2-ethylpropyl group, a 1-ethyl-2-methylpropyl group, a 1,1,2-trimethylpropyl group, a 1-propylpropyl group, a 1-methylbutyl group, a 2-methylbutyl group, a 1,1-dimethylbutyl group, a 1,2-dimethylbutyl group, a 2,2-dimethylbutyl group, a 1,3-dimethylbutyl group, a 2,3-dimethylbutyl group, a 2-ethylbutyl group, a 2-methylpentyl group, or a 3-methylpentyl group.

Also, the term "arylene group" may refer to a bivalent substituent derived from the above-described aryl group.

Also, the "heteroarylene group" may refer to a bivalent substituent derived from the above-described heteroaryl group.

In one exemplary embodiment of Formula 1, $R_1$, $R_2$, $R_3$ and $R_4$ are each independently an alkyl group having 1 to 30 carbon atoms, an alkenyl group having 1 to 30 carbon atoms, an alkoxy group having 1 to 30 carbon atoms or an acyl group having 1 to 30 carbon atoms, and at least one of hydrogens in $R_1$, $R_2$, $R_3$ and $R_4$ may be each independently a compound substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

In another exemplary embodiment of Formula 1, $R_1$, $R_2$, $R_3$ and $R_4$ are each independently an aryl group having 6 to 30 carbon atoms, a heteroaryl group having 2 to 30 carbon atoms or a heterocyclic group having 3 to 30 carbon atoms, and at least one of hydrogens in $R_1$, $R_2$, $R_3$ and $R_4$ may each be independently a compound substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

In still another exemplary embodiment of Formula 1, $R_1$, $R_2$, $R_3$ and $R_4$ are each independently represented by Formula 2,

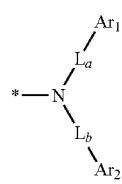

[Formula 2]

In Formula 2, $L_a$ and $L_b$ are each independently an alkylene group having 1 to 10 carbon atoms or an arylene group having 6 to 20 carbon atoms, $Ar_1$ and $Ar_2$ are each independently hydrogen, an alkyl group having 1 to 20 carbon atoms, an aryl group having 6 to 20 carbon atoms, or a heteroaryl group having 2 to 20 carbon atoms, and at least one of hydrogens in $R_1$, $R_2$, $R_3$, $R_4$, $L_a$, $L_b$, $Ar_1$ and $Ar_2$ may be each independently a compound substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

In yet another exemplary embodiment of Formula 1, $R_1$, $R_2$, $R_3$ and $R_4$ are each independently represented by Formula 3,

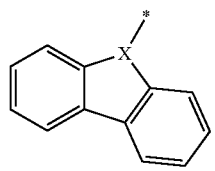

[Formula 3]

In Formula 3,

X is C—($R_{11}$) or N, $R_{11}$ is hydrogen, an alkyl group having 1 to 10 carbon atoms, an aryl group having 6 to 20 carbon atoms or a heteroaryl group having 3 to 20 carbon atoms, and at least one of hydrogens in $R_1$, $R_2$, $R_3$, $R_4$ and $R_{11}$ may be each independently a compound substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

In yet another exemplary embodiment of Formula 1, $R_1$, $R_2$, $R_3$ and $R_4$ are each independently Formula 4,

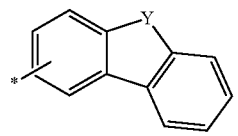

[Formula 4]

In Formula 4,

Y is C—($R_{12}$)$_2$, N-$L_c$-$Ar_3$, O or S, $R_{12}$ is hydrogen, an alkyl group having 1 to 10 carbon atoms, an aryl group having 6 to 20 carbon atoms or a heteroaryl group having 2 to 20 carbon atoms, $L_c$ is an alkylene group having 1 to 10 carbon atoms or an arylene group having 6 to 20 carbon atoms, $Ar_3$ is hydrogen, an alkyl group having 1 to 20 carbon atoms, an aryl group having 6 to 20 carbon atoms or a heteroaryl group having 2 to 20 carbon atoms, and at least one of hydrogens in $R_1$, $R_2$, $R_3$, $R_4$, $R_{12}$, $L_c$ and $Ar_3$ may be each independently a compound substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

In yet another exemplary embodiment of Formula 1, $R_1$, $R_2$, $R_3$ and $R_4$ are each independently represented by Formula 5,

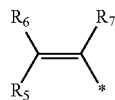

[Formula 5]

In Formula 5, $R_5$ to $R_7$ are each independently hydrogen, an alkyl group having 1 to 10 carbon atoms, an aryl group having 6 to 20 carbon atoms or a heteroaryl group having 2 to 20 carbon atoms, and at least one of hydrogens in $R_1$ to $R_7$ may be each independently a compound substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

In yet another exemplary embodiment of Formula 1, $R_1$, $R_2$, $R_3$ and $R_4$ are each independently represented by Formula 6,

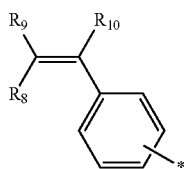

[Formula 6]

In Formula 6, $R_8$ to $R_{10}$ are each independently hydrogen, an alkyl group having 1 to 10 carbon atoms, an aryl group having 6 to 20 carbon atoms or a heteroaryl group having 2 to 20 carbon atoms, and at least one of hydrogens in $R_1$ to $R_4$, and $R_8$ to $R_{10}$ may be each independently a compound substituted or not substituted with at least one substituent selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

In one example, the compound of Formula 1 may be a germanium-centered symmetrical structure. In the present invention, the symmetrical structure refers to a structure in which substituents are symmetrically linked to its center (or centered atom), and includes a structure having a difference in the range of isomers of each substituent. For example, the symmetrical structure is defined to be a structure in which a first substituent and a second substituent, which have the same structure, are linked to a center, and also includes a structure in which the first substituent is a trans isomer, and the second substituent is a cis isomer.

A specific example of the exemplary embodiment of the compound of Formula 1 may be at least one selected from the group consisting of Formulas 7 to 34.

[Formula 7]

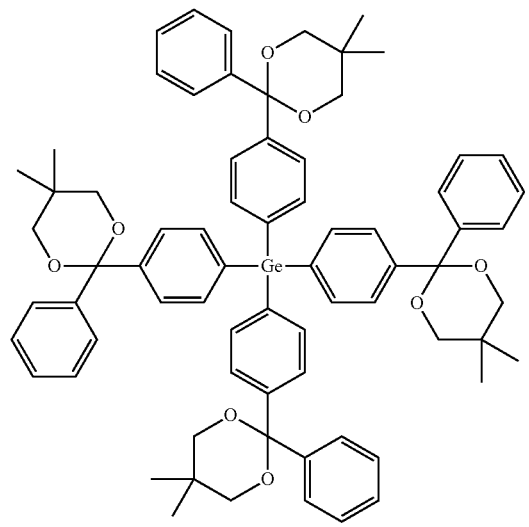

[Formula 8]

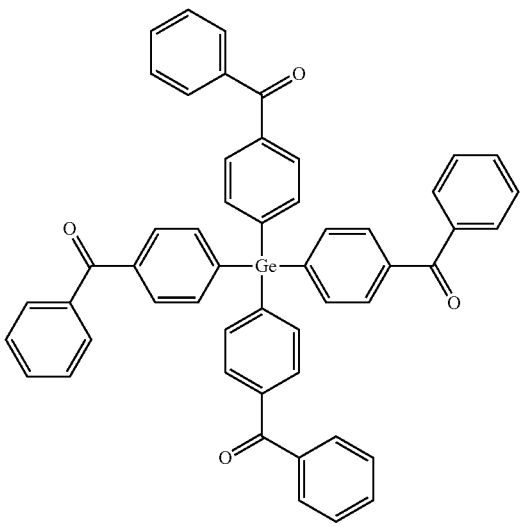

[Formula 9]
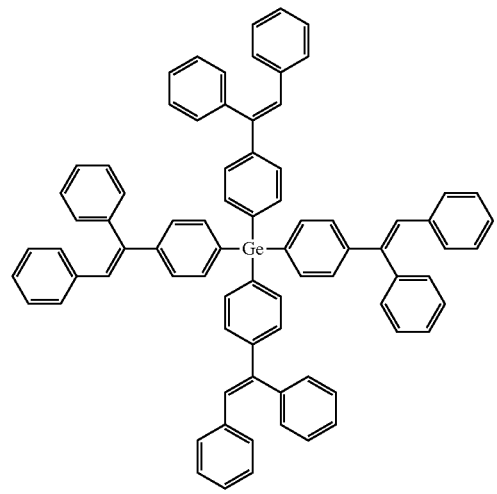
[Formula 10]
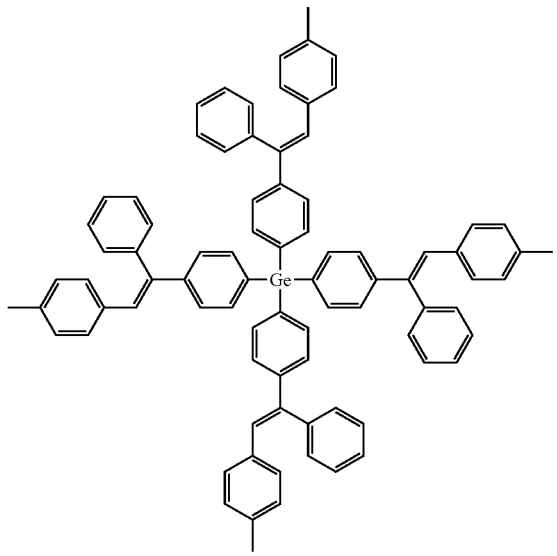
[Formula 11]
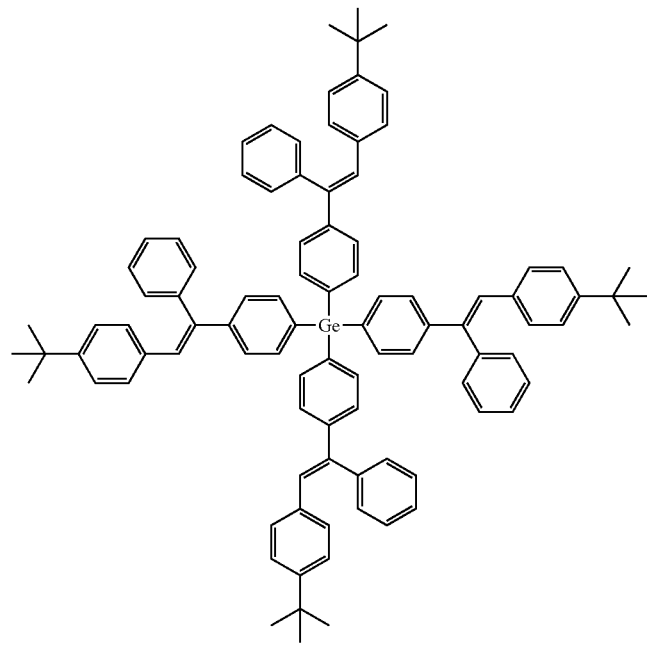

[Formula 12]
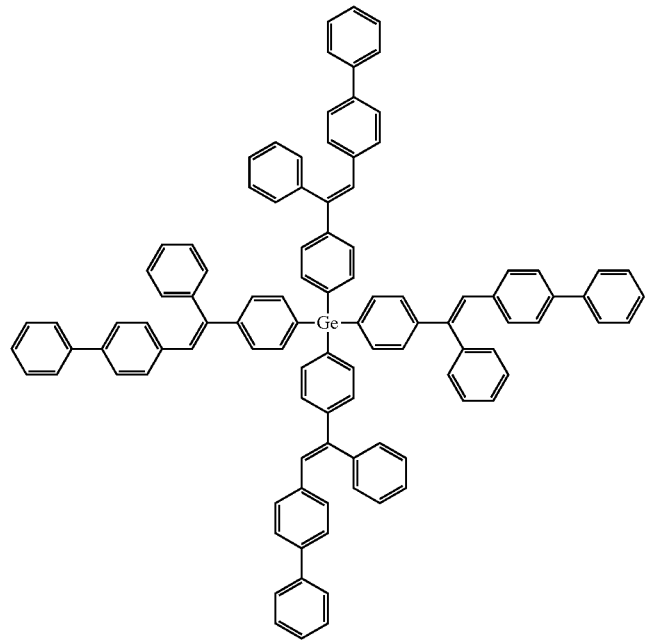
[Formula 13]
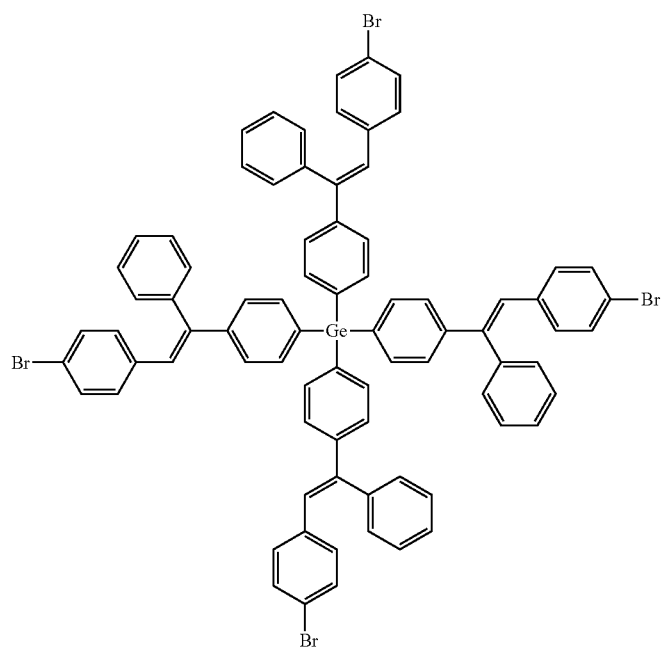

[Formula 14]
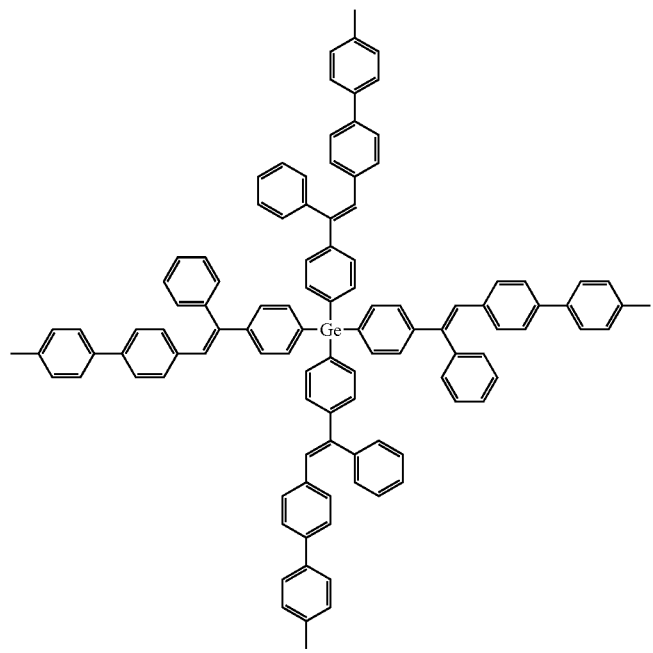
[Formula 15]
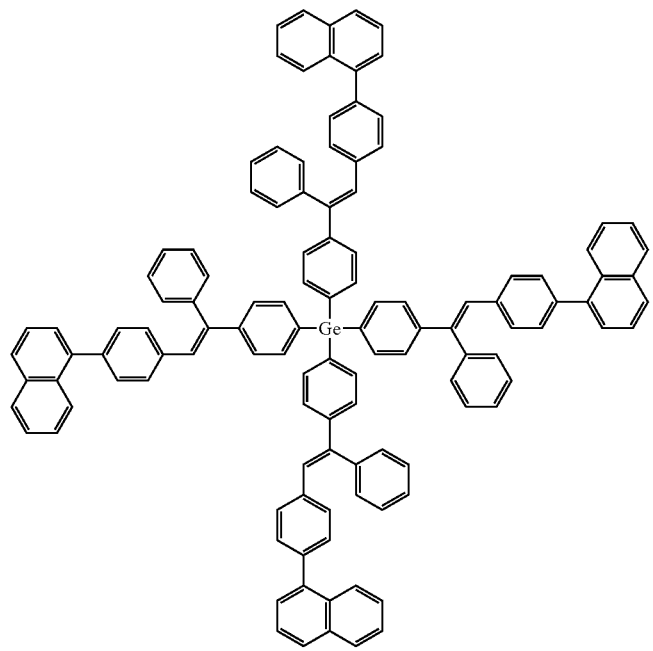

[Formula 16]
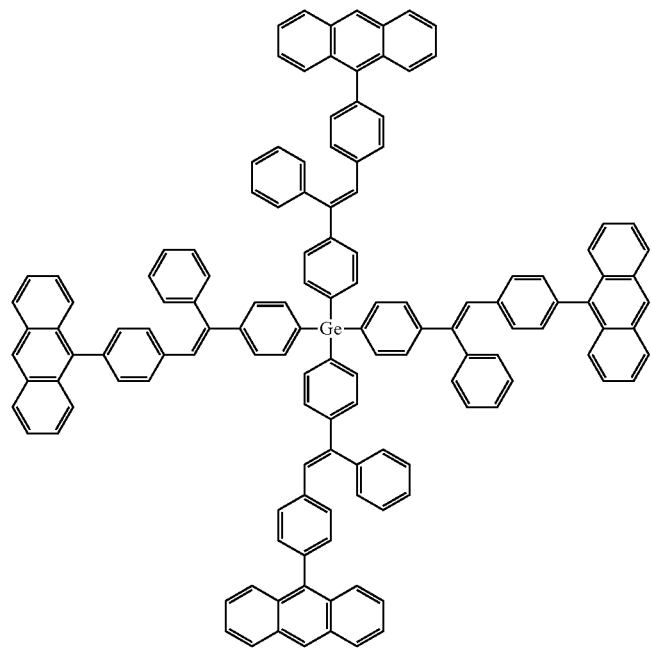
[Formula 17]
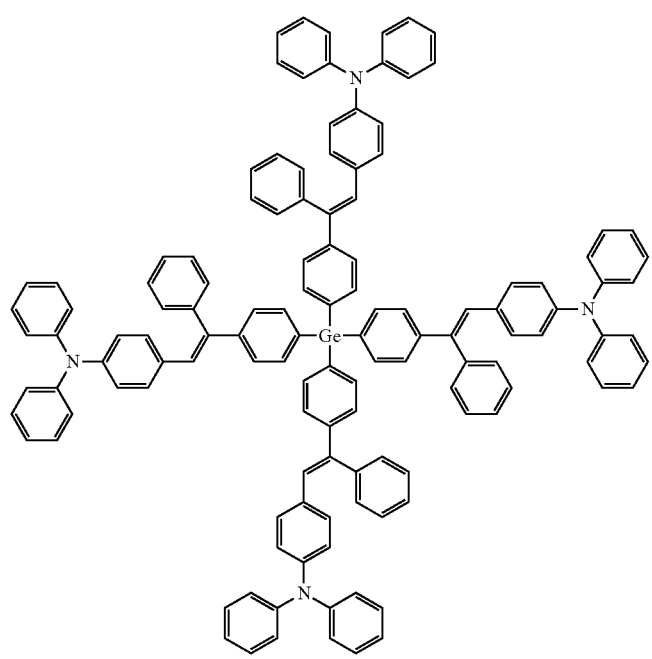

[Formula 18]
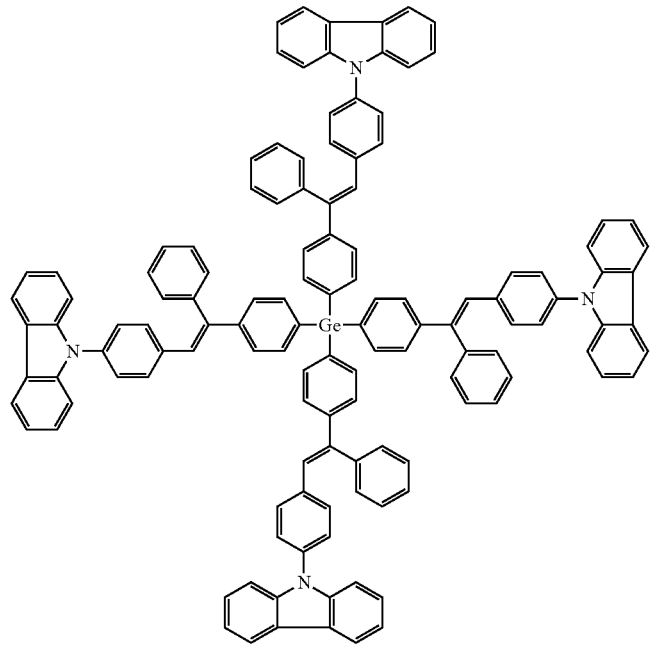
[Formula 19]
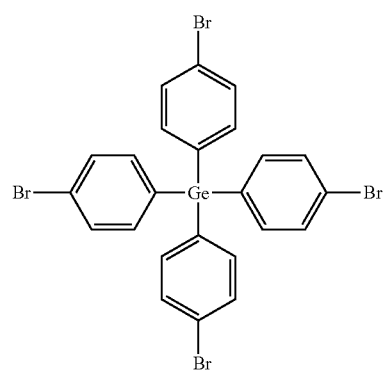
[Formula 20]
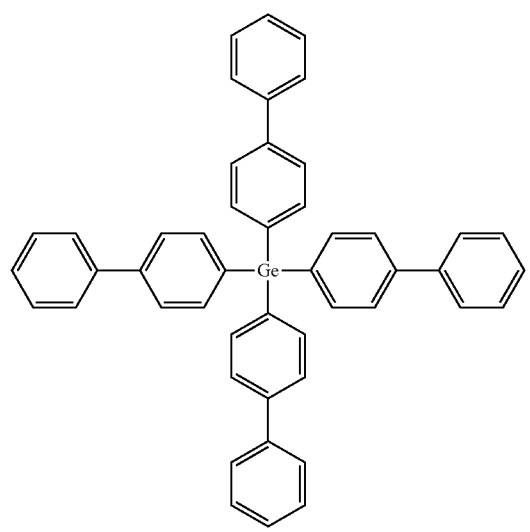

[Formula 21]
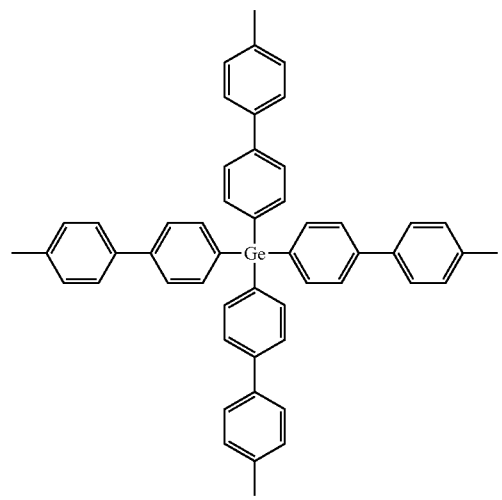
[Formula 22]
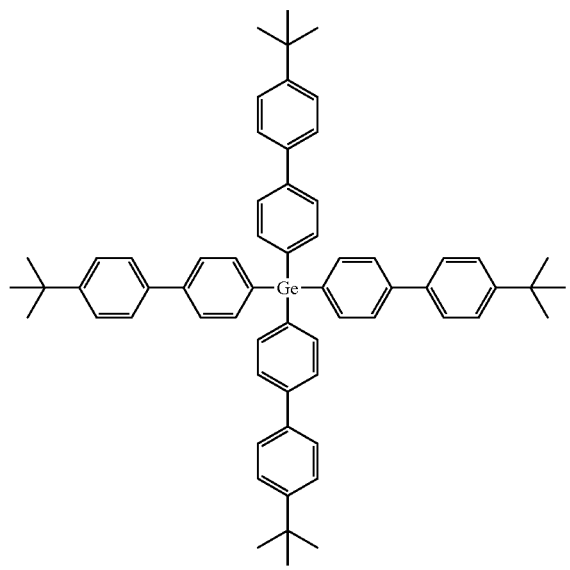
[Formula 23]
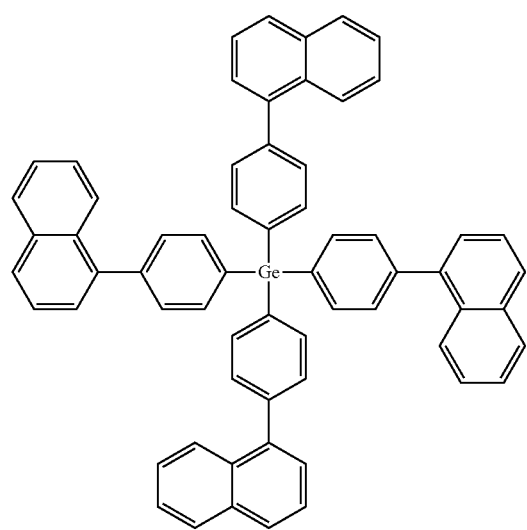
[Formula 24]
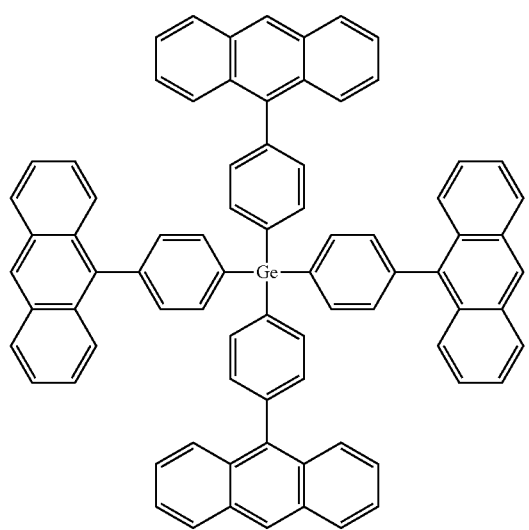

[Formula 25]
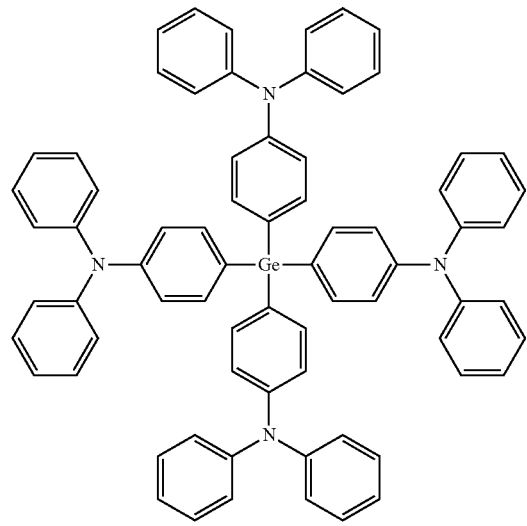
[Formula 26]
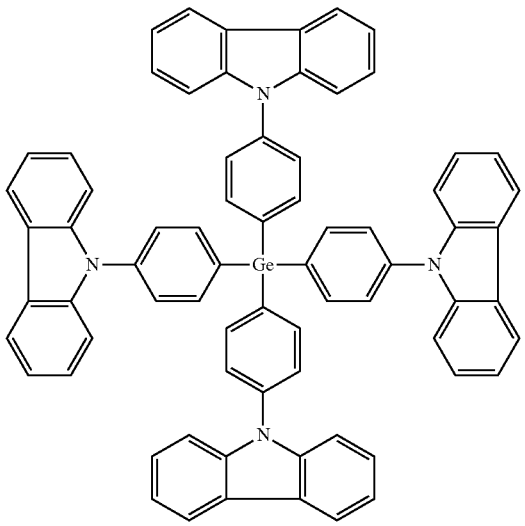
[Formula 27]
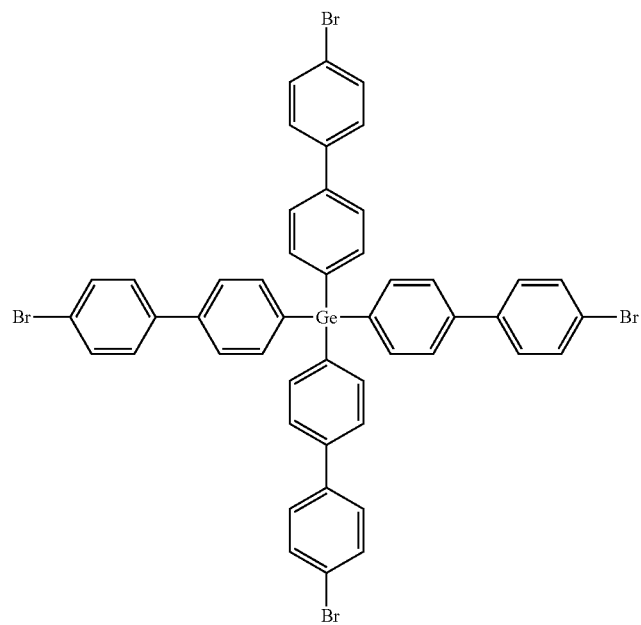

-continued
[Formula 28]
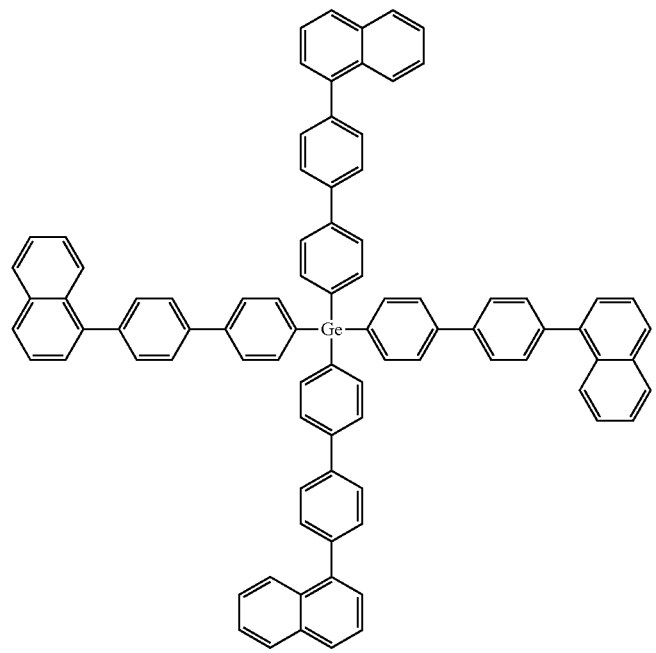
[Formula 29]
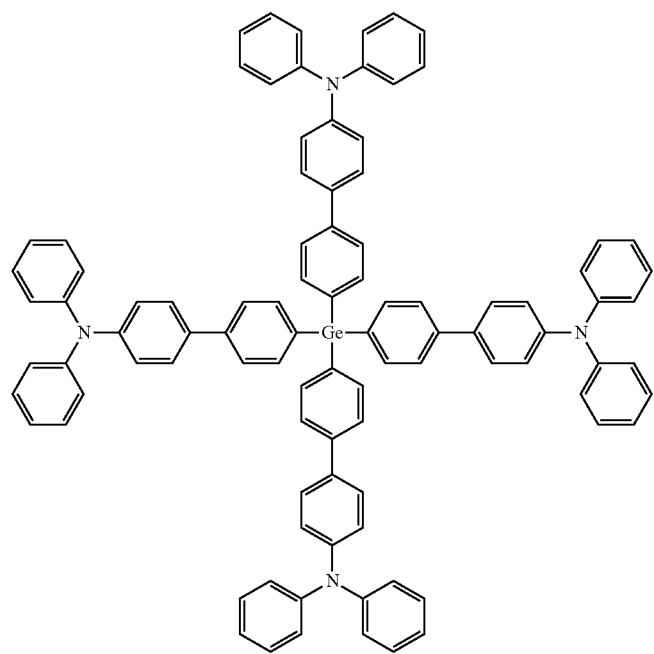

[Formula 30]
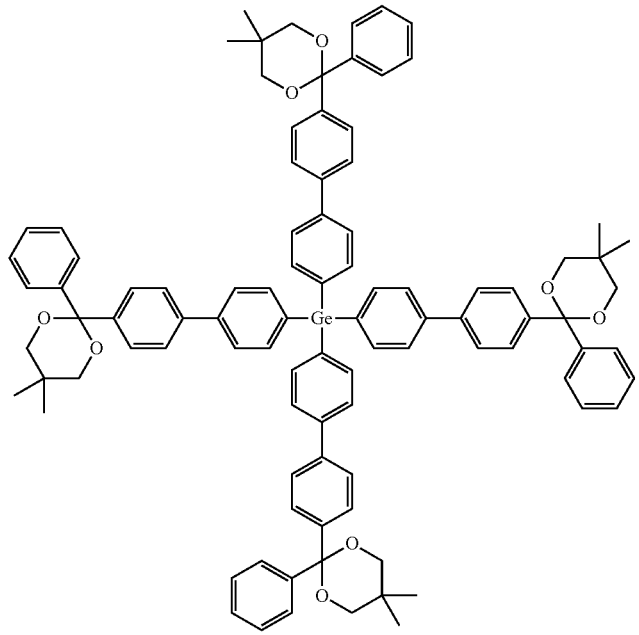
[Formula 31]
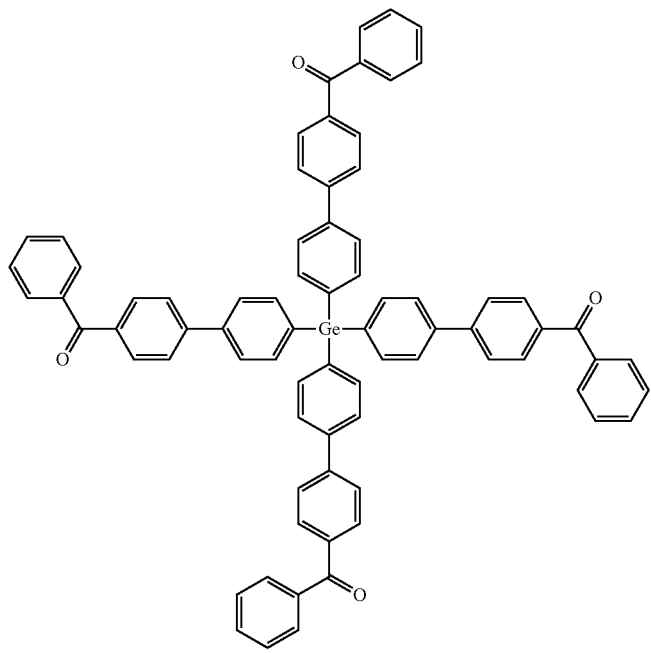

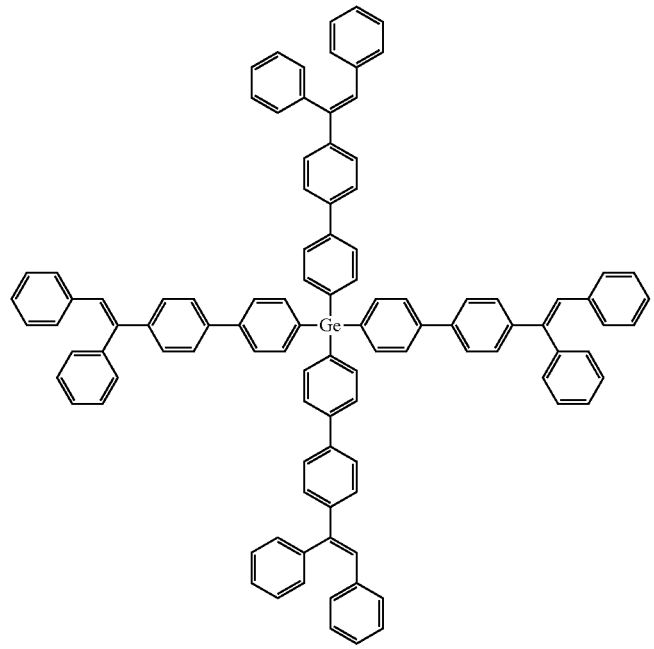
[Formula 32]
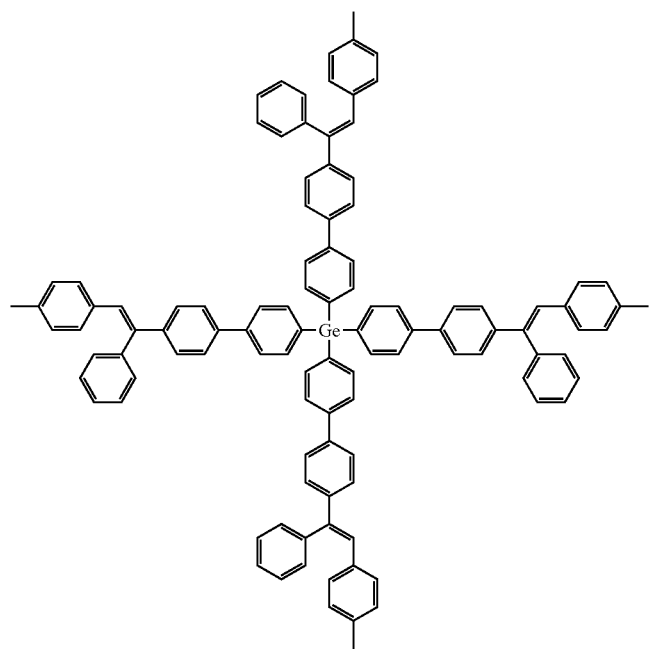
[Formula 33]

[Formula 34]
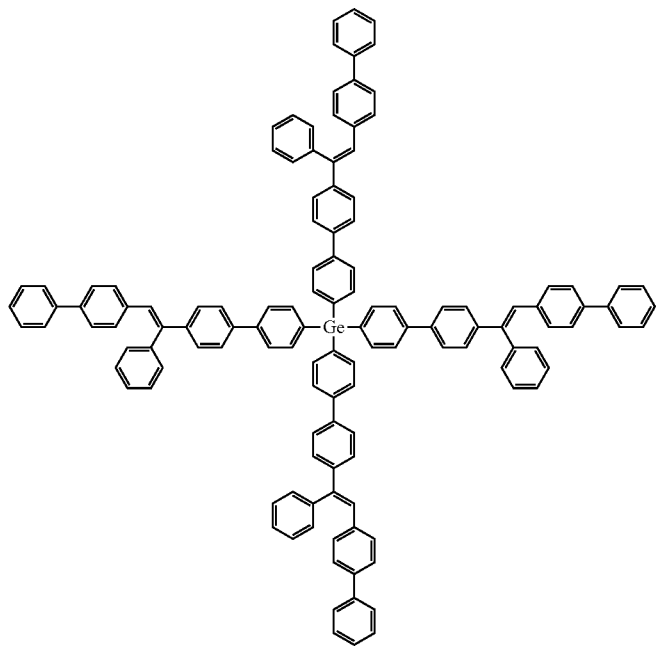
In one exemplary embodiment, a process of synthesizing the compounds may include Reaction Formulas 1 to 6.
[Reaction Formula 1]
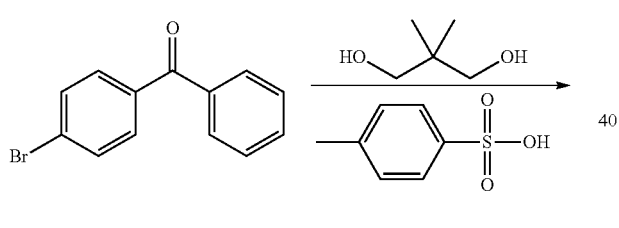
[Reaction Formula 2]
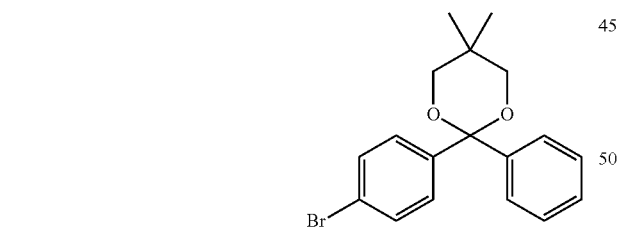
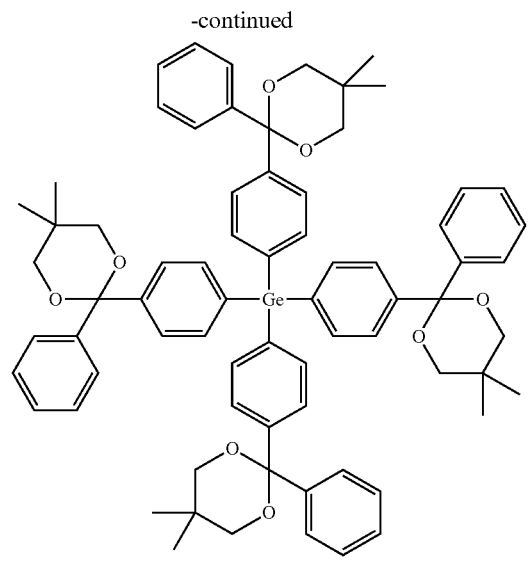
[Reaction Formula 3]
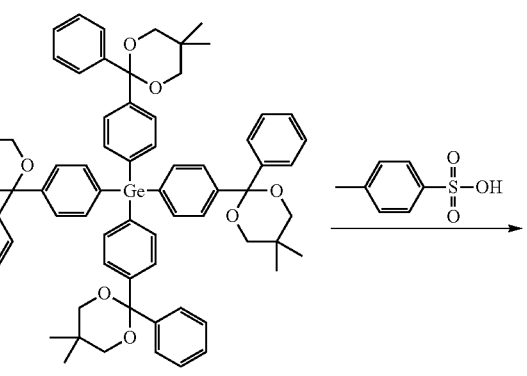
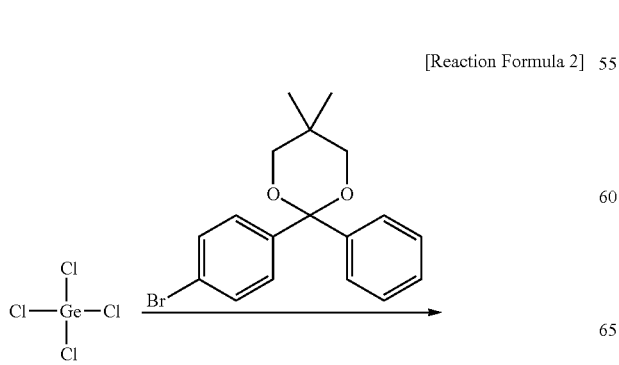

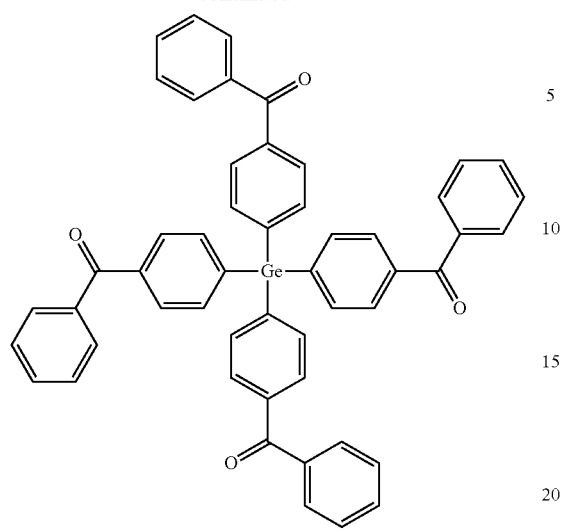

[Reaction Formula 4]

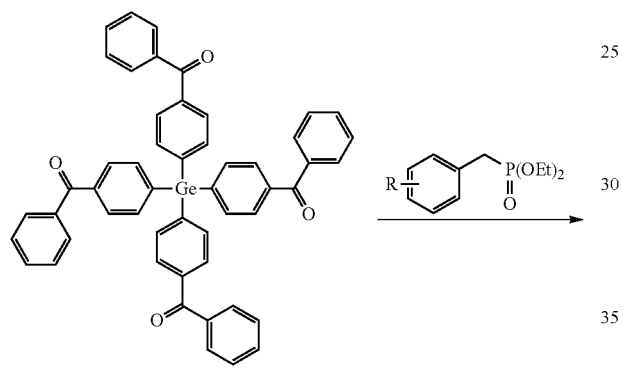

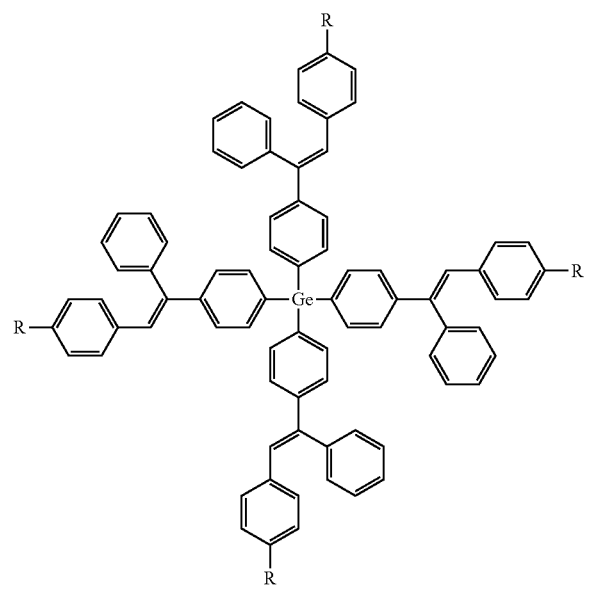

[Reaction Formula 5]

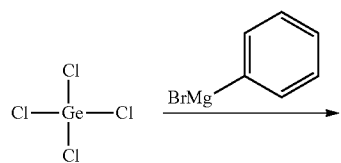

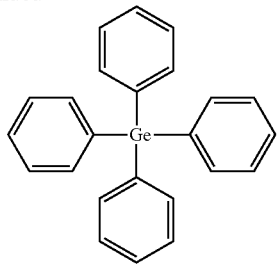

[Reaction Formula 6]

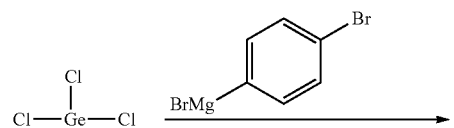

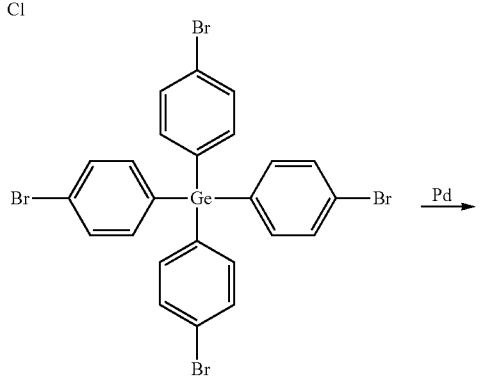

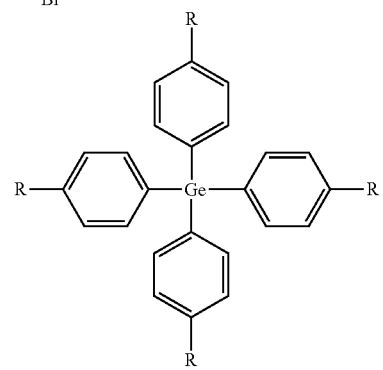

In Reaction Formulas 1 to 6,

R may be each independently selected from the group consisting of hydrogen, an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, an amine group, a halogen group, a cyano group, a nitro group, a hydroxyl group and a carboxyl group.

The present invention may provide an optoelectronic device including a germanium-centered dendrimer compound according to the present invention. For example, the optoelectronic device may include an organic light-emitting device, an organic solar cell or an organic semiconductor.

As an example, the optoelectronic device may be an organic light-emitting device, which may include a first electrode; a second electrode; and an organic layer disposed between the first electrode and the second electrode.

In another example, in the organic light-emitting device, the organic layer disposed between the first electrode and the second electrode may include at least one of a hole transport layer, a light-emitting layer, a hole blocking layer, an electron transport layer and an electron injection layer, which may include a germanium-centered dendrimer compound represented by Formula 1.

[Formula 1]

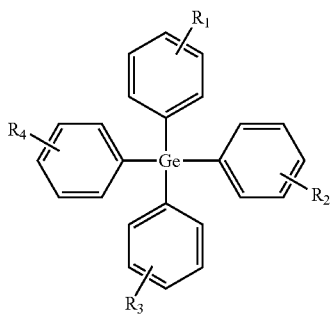

The compound of Formula 1 is a new compound according to the present invention, which is substantially the same as described above. Therefore, detail descriptions of $R_1$, $R_2$, $R_3$ and $R_4$ will be omitted.

FIG. 1 schematically shows a cross-sectional view of an organic light-emitting device as an example of the optoelectronic device according to the present invention. Referring to FIG. 1, the organic light-emitting device may include a first electrode 20, a hole transport layer 30, a light-emitting layer 40, a hole blocking layer 50, an electron transport layer 60, an electron injection layer 70 and a second electrode 80, which are formed on a substrate 10.

In one exemplary embodiment, the first electrode 20 may be formed of a conductive material on the substrate 10. In one example, the first electrode 20 may be a transparent electrode. Here, the first electrode 20 may be formed of indium tin oxide (ITO). On the contrary, the first electrode 20 may be an opaque (reflective) electrode. Here, the first electrode 20 may have an ITO/silver (Ag)/ITO structure. The first electrode 20 may become an anode of the optoelectronic device.

The hole transport layer 30 may be formed on the first electrode 20 to be interposed between the first electrode 20 and the light-emitting layer 40. For example, the hole transport layer 30 may include the germanium-centered dendrimer compound represented by Formula 1 according to the present invention as a host or dopant.

The light-emitting layer 40 may be interposed between the hole transport layer 30 and the second electrode 80, and a wavelength of light emitted from the light-emitting layer 40 may vary depending on a type of a compound forming the light-emitting layer 40. The light-emitting layer 40 may include the germanium-centered dendrimer compound of Formula 1 according to the present invention as a dopant material. For example, the germanium-centered dendrimer compound included in the light-emitting layer may be included as a host or dopant.

For example, the optoelectronic device may include the germanium-centered dendrimer compound according to the present invention, and thus have excellent thermal stability and improved light-emitting efficiency, and increase a lifetime.

The optoelectronic device according to the present invention may be used as display and lighting devices. Likewise, the optoelectronic device exemplified in the present invention may be used in various electronic devices such as the display device or lighting device.

EXAMPLES

Hereinafter, the present invention will be described in further detail with reference to the following examples. The examples of the present invention are merely provided to explain the detail description of the present invention, and thus not limit the scope of the present invention.

Example 1

4-bromobenzophenone, 2,2-dimethylpropane-1,3-diol and 4-methylbenzenesulfonic acid were respectively added to a round bottom flask at amounts of 20 g (76.6 mmol), 12 g (115 mmol), and 0.66 g (3.833 mmol), mixed with 600 ml of toluene, and refluxed at 135° C. for 19 hours. After the reaction, extraction was carried out using a sodium carbonate aqueous solution, water and chloroform, washing was carried out with a saturated NaCl aqueous solution, dehydrated with $MgSO_4$, and then a solvent was removed through distillation under reduced pressure. Afterward, the resultant mixture was recrystallized using isopropanol, thereby obtaining light pink 2-(4-bromophenyl)-5,5-dimethyl-2-phenyl-1,3-dioxane with a yield of 71.8%.

TLC $R_f$=7.92 (n-hexane:$Et_2O$=1:1); $^1$H-NMR (600 MHz, $CDCl_3$) δ 0.00 (TMS), 0.97 (d, 6H), 3.58 (s, 4H), 7.25-7.32 (m, 7H), 7.92-7.96 (m, 2H); MALDI-TOF MS m/z=[347.25 $M^+$+2]

Afterward, 20.63 g (60 mmol) of 2-(4-bromophenyl)-5,5-dimethyl-2-phenyl-1,3-dioxane, which was obtained as described above, was added to a round bottom flask 1 and deaerated using a vacuum pump for 30 minutes, and then argon gas was injected. Subsequently, the resultant mixture was dissolved by injecting 50 ml of THF with a syringe. 2.9 g (120 mmol) of fine magnesium powder was added to another round bottom flask 2 and deaerated using a vacuum pump for 30 minutes, and then argon gas was injected. Subsequently, 100 ml of THF was added using a syringe, and the mixture in the round bottom flask 1 was slowly dropped into the mixture of the round bottom flask 2 using a dropping funnel to prepare a Grignard reagent. Residual magnesium of the prepared Grignard reagent was precipitated, and then only a solvent layer was extracted. After deaerated for 30 minutes, the resultant mixture was transferred to an argon gas-injected round bottom flask 3, and 1 ml (8.74 mmol) of germanium chloride was injected using a syringe. The resultant mixture was stirred for 72 hours, cooled to room temperature after the reaction, and diluted with chloroform. An organic layer was washed with a 1% HCl aqueous solution, water and a saturated NaCl aqueous solution, dehydrated with $MgSO_4$, and distilled under reduced pressure to remove the solvent. Afterward, the resultant product was recrystallized with chloroform and normal hexane, thereby obtaining a white compound of Formula 7 (tetrakis(4-(5,5-dimethyl-2-phenyl-1,3-dioxan-2-yl)phenyl)germane) with a yield of 54%.

[Formula 7]

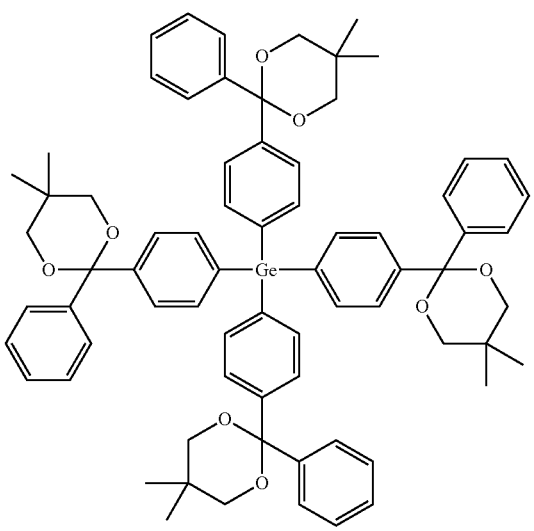

TLC R$_f$=4.85 (n-hexane:THF=3:1); m.p 285° C.; $^1$H-NMR (600 MHz, CDCl$_3$) δ 0.00 (TMS), 0.97 (d, 24H), 3.58 (s, 16H), 7.25-7.41 (m, 20H), 7.42-7.54 (m, 16H); MALDI-TOF MS m/z=[1142.01 M$^+$+1]

Example 2

3 g (2.627 mmol) of the compound of Formula 7 prepared in Example 1 and 0.45 g (2.627 mmol) of 4-methylbenzenesulfonic acid, 150 ml of THF, 150 ml of acetone and 15 ml of DI-water were added to a round bottom flask, and stirred under reflux for 144 hours. After the reaction, the resultant mixture was cooled to room temperature, extracted with methyl chloride, washed with a saturated NaCl aqueous solution, dehydrated with MgSO$_4$, and distilled under reduced pressure to remove a solvent. Afterward, the resultant product was washed with n-hexane and diethyl ether, thereby obtaining a white compound of Formula 8 (4,4',4'',4'''-germanetetrayltetrakis(benzene-4,1-diyl)tetrakis(phenylmethanone)) with a yield of 93.9%.

[Formula 8]

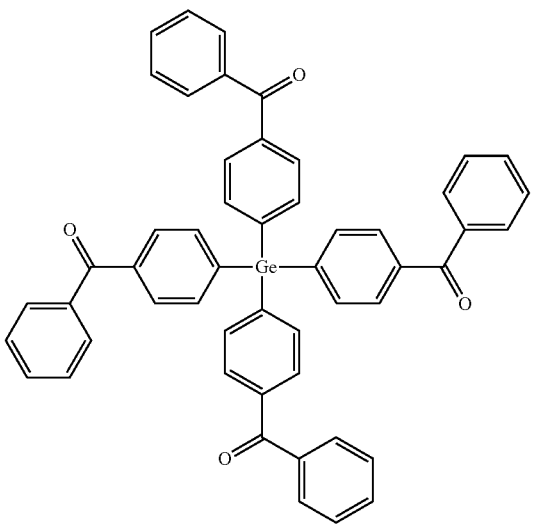

TLC R$_f$=3.33 (n-hexane:THF=3:1); $^1$H-NMR (600 MHz, CDCl$_3$) δ 0.00 (TMS), 7.47-7.52 (m, 8H), 7.58-7.64 (m, 4H), 7.69-7.38 (m, 8H), 7.83-7.88 (m, 16H); MALDI-TOF MS m/z=[797.48 M$^+$+1]

Example 3

1.27 g (11.29 mmol) of potassium tert-butoxide was added to a round bottom flask and deaerated using a vacuum pump for 30 minutes, and then argon gas was injected. Afterward, 300 ml of THF was added using a syringe, 1.57 ml (7.52 mmol) of diethylbenzyl phosphonate was added, and then the resultant mixture was stirred for 1 hour. Afterward, 1.0 g (1.25 mmol) of the compound of Formula 8 prepared in Example 2 was added, and the mixture was refluxed for 72 hours. After the reaction, a 1% HCl aqueous solution was added, and the mixture was cooled to room temperature and diluted with chloroform. Afterward, the resultant mixture was washed with water and a saturated NaCl aqueous solution, dehydrated with MgSO$_4$, and distilled under reduced pressure to remove a solvent. Subsequently, column chromatography was performed, thereby obtaining a white compound of Formula 9 with a yield of 84%.

[Formula 9]

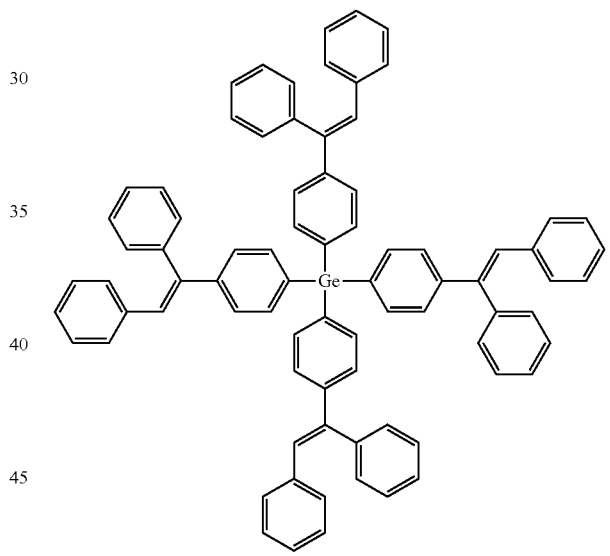

TLC R$_f$=5.62 (n-hexane:THF=3:1); $^1$H-NMR (600 MHz, CDCl$_3$) δ 0.00 (TMS), 7.00-7.02 (m, 8H), 7.08-7.13 (m, 12H), 7.23-7.37 (m, 30H), 7.49-7.55 (m, 10H); MALDI-TOF MS m/z=[1093.97 M$^+$+1]

Example 4

1.27 g (11.29 mmol) of potassium tert-butoxide was added to a round bottom flask and deaerated using a vacuum pump for 30 minutes, and then argon gas was injected. Afterward, 300 ml of THF was added using a syringe, and 1.57 ml (7.52 mmol) of diethyl-4-methylbenzyl phosphonate was added and the mixture was stirred for 1 hour. Afterward, 1.0 g (1.25 mmol) of the compound of Formula 8 prepared in Example 2 was added and refluxed for 72 hours. After the reaction, a 1% HCl aqueous solution was added, and the mixture was cooled to room temperature and diluted with chloroform. Next, the resultant mixture was washed with water and saturated, washed with a NaCl aqueous solution, dehydrated with MgSO$_4$, and distilled under reduced pressure to remove a solvent. Subsequently, column chromatography was performed, thereby obtaining a white compound of Formula 10 with a yield of 67%.

[Formula 10]

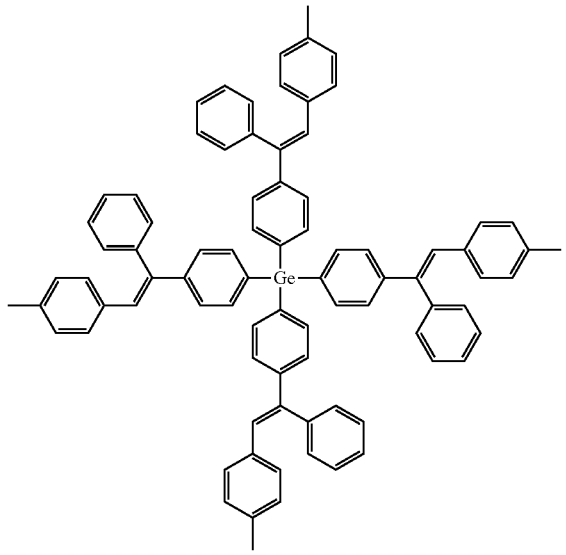

TLC R$_f$=6.25 (n-hexane:THF=3:1); $^1$H-NMR (600 MHz, CDCl$_3$) δ 0.00 (TMS), 2.13-2.22 (m, 12H), 6.91-7.03 (m, 20H), 7.21-7.37 (m, 26H), 7.49-7.59 (m, 10H); MALDI-TOF MS m/z=[1150.08 M$^+$+1]

Example 5

1.27 g (11.29 mmol) of potassium tert-butoxide was added to a round bottom flask and deaerated using a vacuum pump for 30 minutes, and then argon gas was injected. Afterward, 300 ml of THF was added using a syringe, 1.57 ml (7.52 mmol) of diethyl-4-tert-butyl benzyl phosphonate was added and the mixture was stirred for 1 hour. Then, 1.0 g (1.25 mmol) of the compound of Formula 8 prepared in Example 2 was added and stirred for 72 hours. After the reaction, a 1% HCl aqueous solution was added, and the mixture was cooled to room temperature and diluted with chloroform. Subsequently, the resultant mixture was washed with water and a saturated NaCl aqueous solution, dehydrated with MgSO$_4$, and distilled under reduced pressure to remove a solvent. Subsequently, column chromatography was performed, thereby obtaining a pure white product of Formula 11 with a yield of 70%.

[Formula 11]

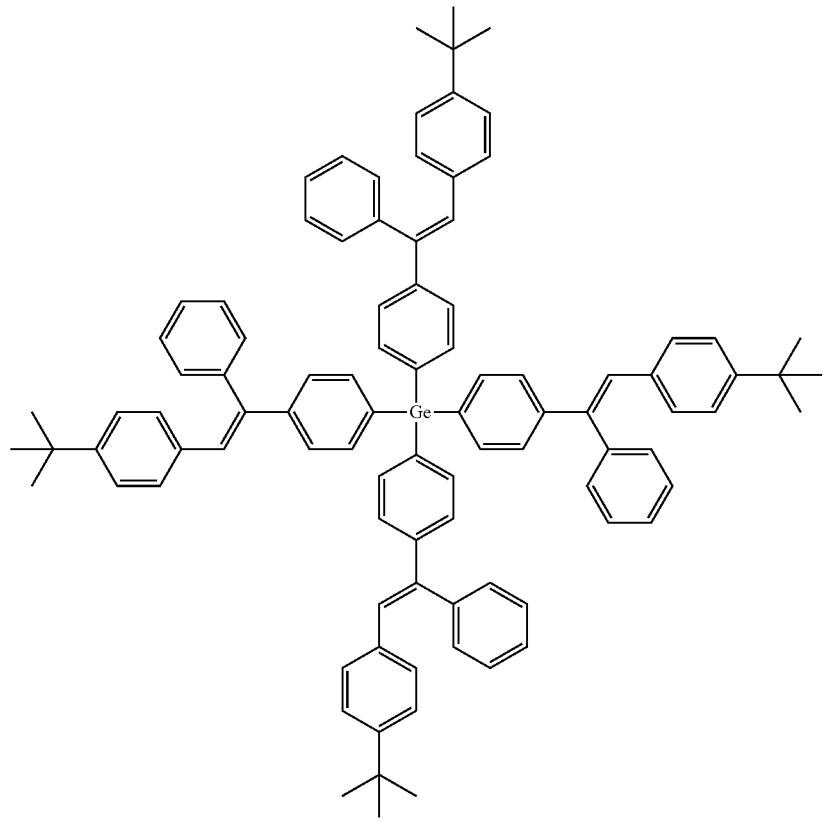

TLC $R_f$=6.25 (n-hexane:THF=3:1); $^1$H-NMR (600 MHz, CDCl$_3$) δ 0.00 (TMS), 1.45-1.49 (m, 36H), 7.00-7.04 (m, 16H), 7.18-7.35 (m, 32H), 7.51-7.58 (m, 8H); MALDI-TOF MS m/z=[1318.40 M$^+$+1]

TLC $R_f$=4.33 (n-hexane:THF=3:1); $^1$H-NMR (600 MHz, CDCl$_3$) δ 0.00 (TMS), 6.98-7.09 (m, 12H), 7.27-7.49 (m, 50H), 7.49-7.62 (m, 14H); MALDI-TOF MS m/z=[1398.36 M$^+$+1]

Example 6

Example 7

1.27 g (11.29 mmol) of potassium tert-butoxide was added to a round bottom flask and deaerated using a vacuum pump for 30 minutes, and then argon gas was injected. Afterward, 300 ml of THF was added using a syringe, and 1.57 ml (7.52 mmol) of diethyl-4-biphenyl phosphonate was added and the mixture was stirred for 1 hour. Subsequently, 1.0 g (1.25 mmol) of the compound of Formula 8 prepared in Example 2 was added and refluxed for 72 hours. After the reaction, a 1% HCl aqueous solution was added, and the mixture was cooled to room temperature and diluted with chloroform. Then, the resultant mixture was washed with water and a saturated NaCl aqueous solution, dehydrated with MgSO$_4$, and distilled under reduced pressure to remove a solvent. Subsequently, column chromatography was performed, thereby obtaining a pure white product of Formula 12 with a yield of 55%.

1.27 g (11.29 mmol) of potassium tert-butoxide was added to a round bottom flask and deaerated using a vacuum pump for 30 minutes, and argon gas was injected. Afterward, 300 ml of THF was added using a syringe, 1.57 ml (7.52 mmol) of diethyl(4-bromobenzyl)phosphonate was added, and the mixture was stirred for 1 hour. Subsequently, 1.0 g (1.25 mmol) of the compound of Formula 8 prepared in Example 2 was added and refluxed for 72 hours. After the reaction, a 1% HCl aqueous solution was added, and the mixture was cooled to room temperature and diluted with chloroform. And then, the resultant mixture was washed with water and a saturated NaCl aqueous solution, dehydrated with MgSO$_4$, and distilled under reduced pressure to remove a solvent. Subsequently, column chromatography was performed, thereby obtaining a pure white product of Formula 13 with a yield of 71%.

[Formula 12]

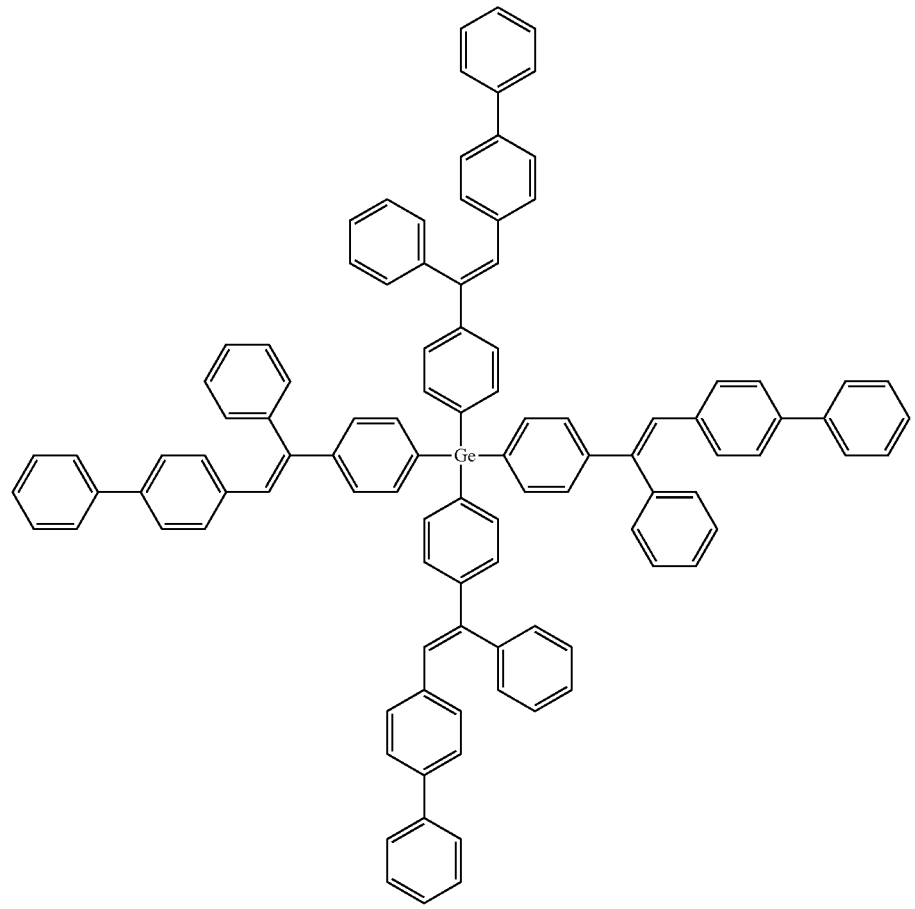

[Formula 13]

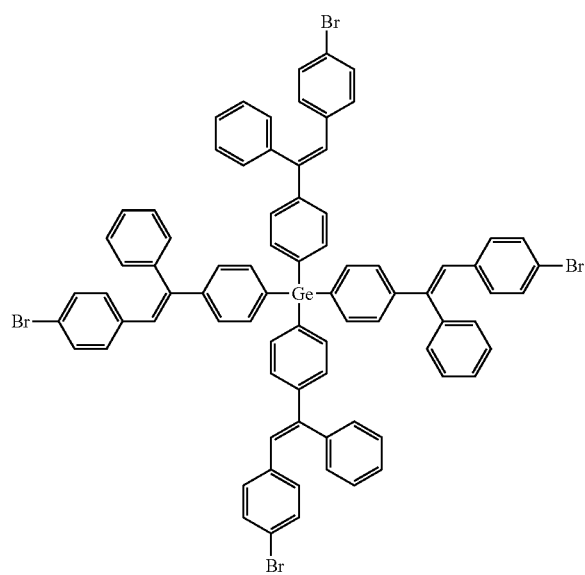

TLC $R_f$=5.76 (n-hexane:THF=3:1); $^1$H-NMR (600 MHz, CDCl$_3$) δ 0.00 (TMS), 7.01-7.03 (m, 8H), 7.08-7.13 (m, 12H), 7.27-7.45 (m, 28H), 7.69-7.78 (m, 8H); MALDI-TOF MS m/z=[1409.56 M$^+$+1]

Example 8

The compound of Formula 13 prepared in Example 7, p-tolylboronic acid and tetrakis(triphenylphosphine)palladium(0) were respectively added to a round bottom flask at 1 g (0.69 mmol), 0.56 g (4.16 mmol), and 0.040 g (0.0345 mmol) and deaerated using a vacuum pump for 30 minutes, and then argon gas was injected. Afterward, 200 ml of DMF was added using a syringe, 0.69 g (5.00 mmol) of potassium carbonate was added and the mixture was stirred under reflux for 72 hours. After the reaction, a base used in the reaction was removed with 1% HCl, and the mixture was cooled to room temperature and diluted with chloroform. Afterward, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 14 (tetrakis(4-(2-(4'-methylbiphenyl-4-yl)-1-phenylvinyl)phenyl)germane) with a yield of 58%.

[Formula 14]

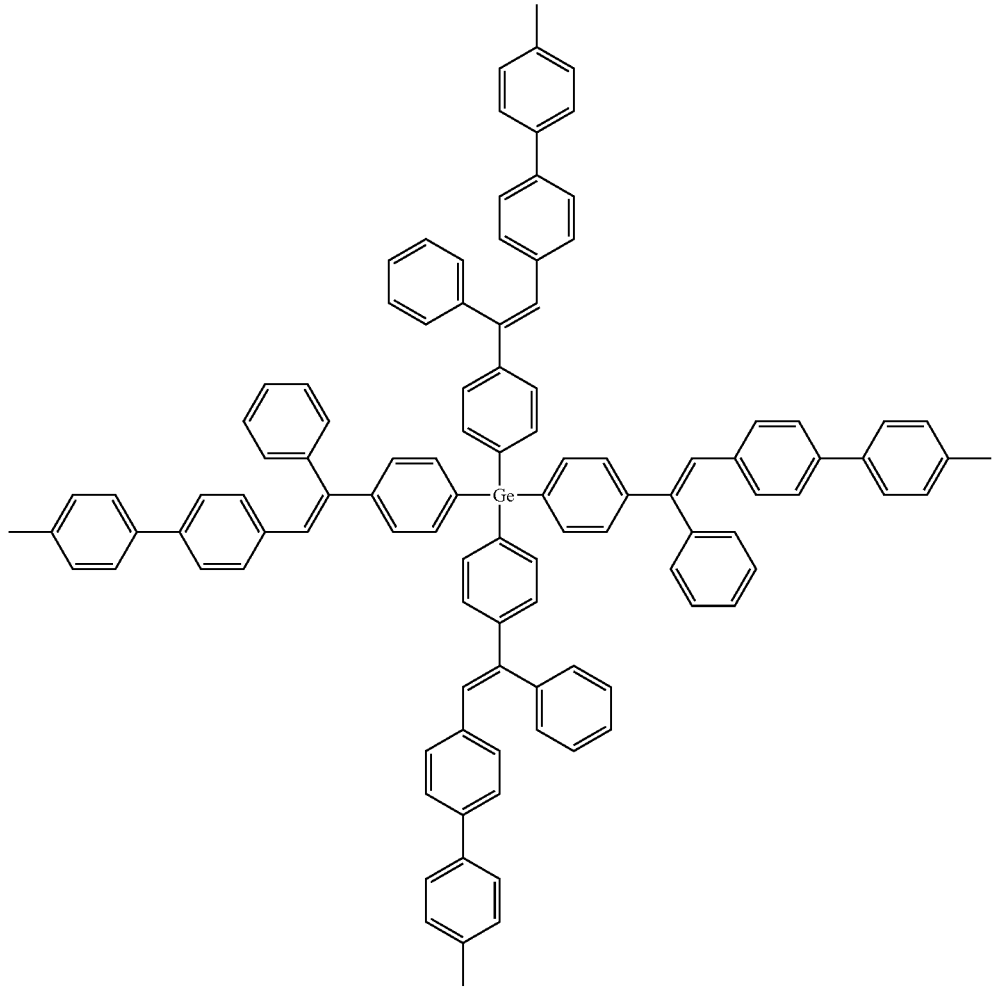

$^1$H-NMR (600 MHz, CDCl$_3$) δ 0.00 (TMS), 2.34 (s, 12H), 6.92 (s, 4H), 7.29-7.34 (m, 20H), 7.44-7.64 (m, 48H); MALDI-TOF MS m/z=[1454.46 M$^+$+1]

Example 9

The compound of Formula 13 prepared in Example 7, naphthalen-1-ylboronic acid and tetrakis(triphenylphosphine)palladium(0) were respectively added to a round bottom flask at 1 g (0.69 mmol), 0.71 g (4.16 mmol) and 0.040 g (0.0345 mmol) and deaerated using a vacuum pump for 30 minutes, and argon gas was injected. Afterward, 200 ml of DMF was added using a syringe, 0.69 g (5.00 mmol) of potassium carbonate was added and the mixture was stirred under reflux for 72 hours. After the reaction, a base used in the reaction was removed with 1% HCl, the mixture was cooled to room temperature, and diluted with chloroform. Afterward, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 15 (tetrakis(4-(2-(4-(naphthalen-1-yl)phenyl)-1-phenylvinyl)phenyl)germane) with a yield of 52%.

$^1$H-NMR (600 MHz, CDCl$_3$) δ 0.00 (TMS), 7.12-7.30 (m, 8H), 7.37-7.56 (m, 60H), 7.82-7.89 (m, 8H), 7.94-8.02 (m, 8H); MALDI-TOF MS m/z=[1598.59 M$^+$+1]

Example 10

The compound of Formula 13 prepared in Example 7, anthracen-9-ylboronic acid and tetrakis(triphenylphosphine) palladium(0) were respectively added to a round bottom flask at 1 g (0.69 mmol), 0.92 g (4.16 mmol) and 0.040 g (0.0345 mmol) and deaerated using a vacuum pump for 30 minutes, and then argon gas was injected. Afterward, 200 ml DMF was added using a syringe, 0.69 g (5.00 mmol) of potassium carbonate was added and the mixture was stirred under reflux for 72 hours. After the reaction, a base used in the reaction was removed with 1% HCl, and the mixture was cooled to room temperature and diluted with chloroform. And then, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 16 (tetrakis(4-(2-(4-(anthracen-9-yl)phenyl)-1-phenylvinyl) phenyl)germane) with a yield of 49%.

[Formula 15]

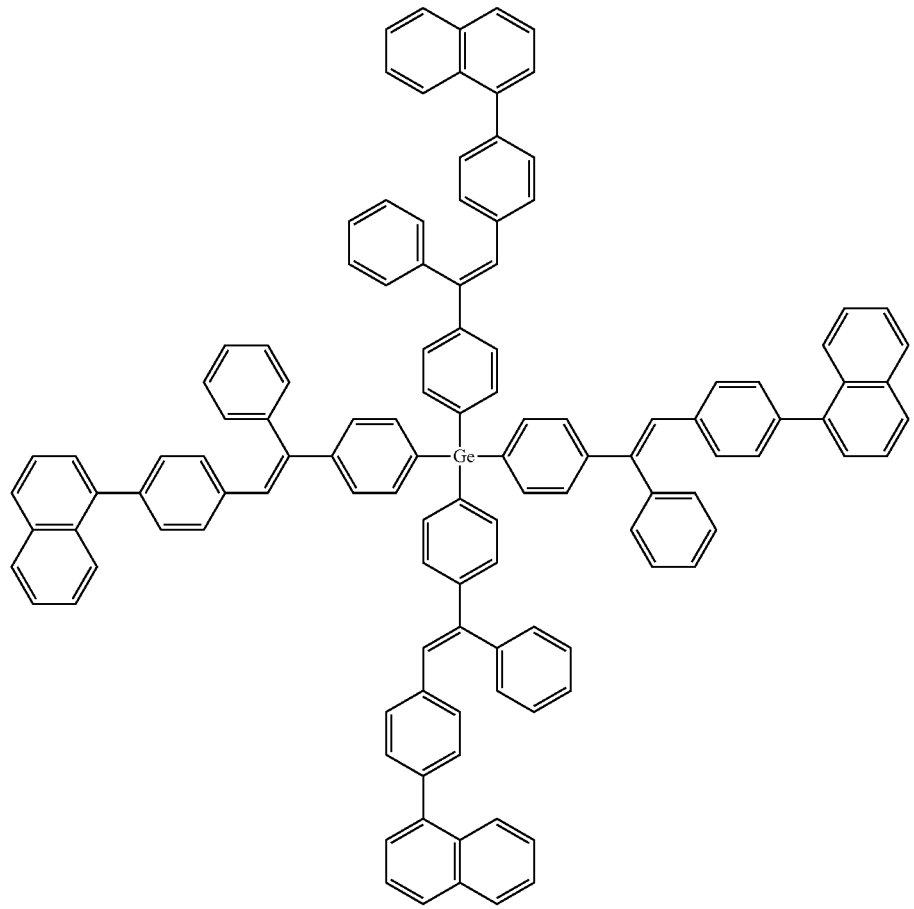

[Formula 16]

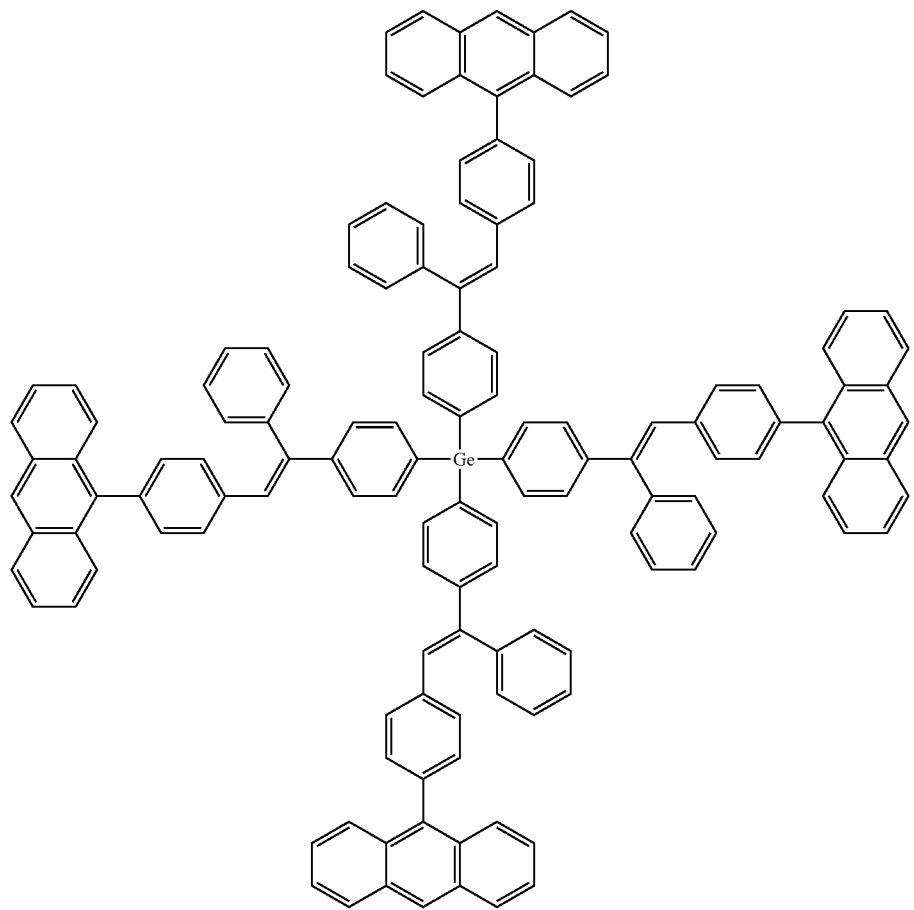

$^1$H-NMR (600 MHz, CDCl$_3$) δ 0.00 (TMS), 7.07-7.10 (m, 8H), 7.39-7.64 (m, 64H), 7.91-8.01 (m, 16H), 8.24-8.27 (m, 4H); MALDI-TOF MS m/z=[1798.83 M$^+$+1]

Example 11

Bis(dibenzylideneacetone)palladium(0) and 2,2'-bis(diphenylphosphino)-1,1'-binaphthalene were respectively added to a round bottom flask at 0.0115 g (0.020 mmol) and 0.025 g (0.040 mmol) and deaerated using a vacuum pump for 30 minutes, and argon gas was injected. Afterward, 200 ml of 1,4-dioxane was added using a syringe. And then, 1 g (0.69 mmol) of the compound of Formula 13 prepared in Example 7 was added, and then the resultant mixture was stirred for 40 minutes. Subsequently, diphenylamine and sodium tert-butoxide were respectively added at 0.70 g (4.14 mmol) and 0.40 g (4.14 mmol), and refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a light yellow compound of Formula 17 (4,4',4'',4'''-(2,2',2'', 2'''-(4,4',4'',4'''-germanetetrayltetrakis(benzene-4,1-diyl)) tetrakis(2-phenylethene-2,1-diyl))tetrakis(N,N-diphenylaniline)) with a yield of 55%.

[Formula 17]

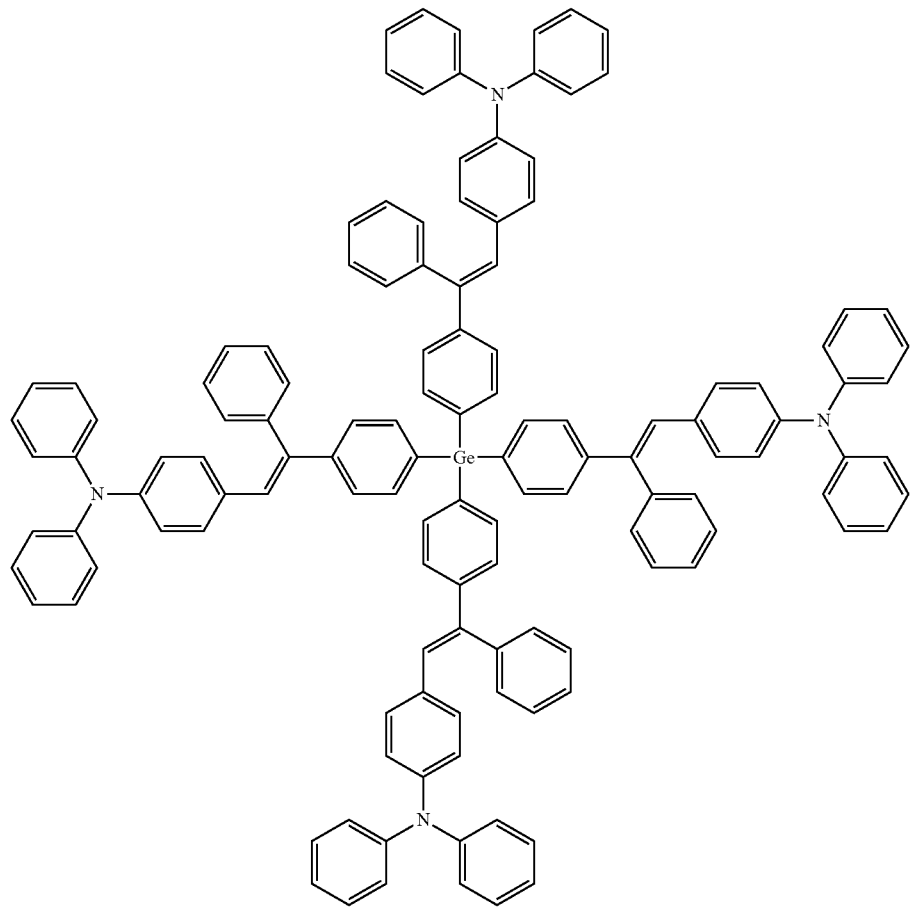

TLC $R_f$=4.66 (n-hexane:THF=3:1); $^1$H-NMR (600 MHz, CDCl$_3$) δ 0.00 (TMS), 6.80-6.87 (m, 8H), 6.95-7.13 (m, 40H), 7.19-7.32 (m, 38H), 7.38-7.49 (m, 10H); MALDI-TOF MS m/z=[1762.8 M$^+$+1]

Example 12

Bis(dibenzylideneacetone)palladium(0) and 2,2'-bis(diphenylphosphino)-1,1'-binaphthalene were respectively added to a round bottom flask at 0.0115 g (0.020 mmol) and 0.025 g (0.040 mmol) and deaerated using a vacuum pump for 30 minutes, and then argon gas was injected. Afterward, 200 ml of 1,4-dioxane was added using a syringe. Subsequently, 1 g (0.69 mmol) of the compound of Formula 13 prepared in Example 7 was added, and then the resultant mixture was stirred for 40 minutes. And then, 9H-carbazole, and sodium tert-butoxide were respectively added at 0.69 g (4.14 mmol) and 0.40 g (4.14 mmol), and refluxed for 72 hours. After the reaction, a base used in the reaction was removed with 1% HCl, and the mixture was cooled to room temperature and diluted with chloroform. Afterward, an organic layer was washed with distilled water and a saturated NaCl aqueous solution, dehydrated with MgSO$_4$, and distilled under reduced pressure to remove a solvent. Subsequently, column chromatography was performed, thereby obtaining a light yellow compound of Formula 18 (tetrakis (4-(2-(4-(9H-carbazol-9-yl)phenyl)-1-phenylvinyl)phenyl) germane) with a yield of 51%.

[Formula 18]

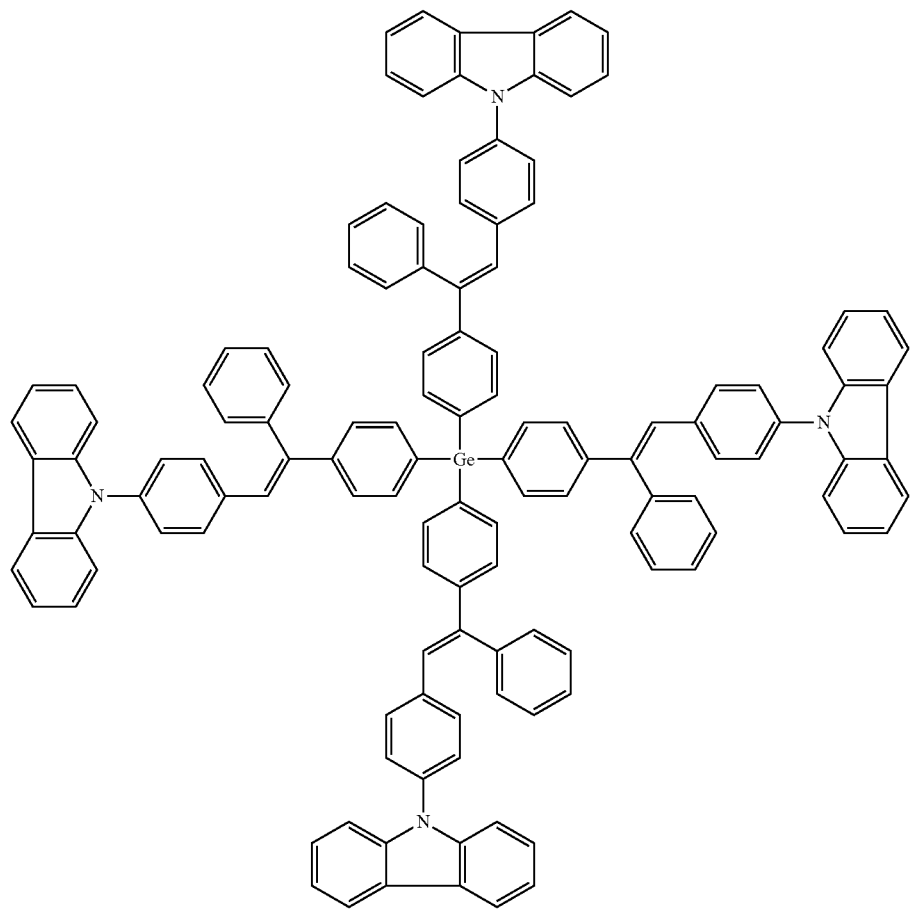

¹H-NMR (600 MHz, CDCl₃) δ 0.00 (TMS), 6.92-6.98 (m, 8H), 7.01-7.18 (m, 36H), 7.21-7.38 (m, 36H), 7.42-7.58 (m, 8H); MALDI-TOF MS m/z=[1754.74 M⁺+1]

Example 13

12.57 g (523.8 mmol) of Mg was added to a round bottom flask, and 140 ml (0.3 m %) of purified THF was added under an argon atmosphere. Subsequently, 200 g (852 mmol) of 1,4-dibromobenzene dissolved in THF was slowly added using a dropping funnel. The resultant mixture was cooled to room temperature and filtered, thereby obtaining a Grignard reagent. The Grignard reagent was added to a single-neck round bottom flask, and 5 ml (42.7 mmol) of germanium(IV) chloride was injected using a glass syringe under an argon atmosphere, and the resultant mixture was refluxed for 24 hours. After the reaction, the resultant mixture was cooled to room temperature, chloroform and distilled water were added, and an organic layer was washed with distilled water and a saturated NaCl aqueous solution. Subsequently, the organic layer was washed with distilled water and a saturated NaCl aqueous solution, dehydrated with MgSO₄, and distilled under reduced pressure to remove a solvent. Subsequently, column chromatography was performed, thereby obtaining a compound of Formula 19 (tetraphenylgermane) with a yield of 48%.

[Formula 19]

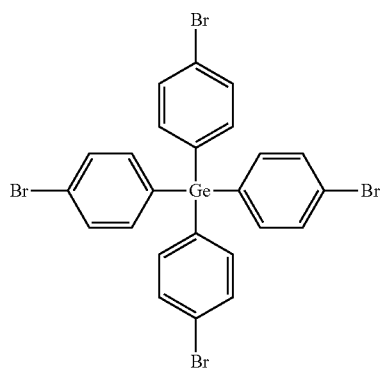

¹H-NMR (600 MHz, CDCl₃) δ 0.00 (TMS), 7.44-7.45 (d, 8H), 7.56-7.58 (d, 8H); HRMS m/z=[696.64 M⁺+1]

Example 14

The compound of Formula 19 prepared in Example 13, phenylboronic acid and tetrakis(triphenylphosphine)palladium(0) were respectively added to a round bottom flask at 1 g (1.44 mmol), 1.05 g (8.64 mmol) and 0.083 g (0.072 mmol) and deaerated using a vacuum pump for 30 minutes, and then argon gas was injected. Afterward, 200 ml of DMF was added using a syringe, and 1.43 g (10.37 mmol) of potassium carbonate was added under stirring, and the mixture was refluxed for 72 hours. After the reaction, a base used in the reaction was removed with 1% HCl, and the mixture was cooled to room temperature and diluted with chloroform. Afterward, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 20 (tetrabiphenyl-4-ylgermane) with a yield of 62%.

[Formula 20]

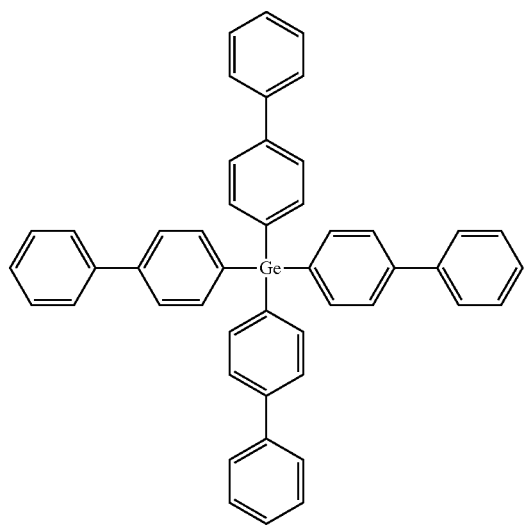

$^1$H-NMR (600 MHz, CDCl$_3$) δ 0.00 (TMS), 7.41-7.44 (m, 4H), 7.51-7.53 (m, 24H), 7.59-7.64 (m, 8H); MALDI-TOF MS m/z=[685.44 M$^+$+1]

Example 15

The compound of Formula 19 prepared in Example 13, p-tolylboronic acid, and tetrakis(triphenylphosphine)palladium(0) were respectively added to a round bottom flask at 1 g (1.44 mmol), 1.17 g (8.64 mmol) and 0.083 g (0.072 mmol) and deaerated using a vacuum pump for 30 minutes, and then argon gas was injected. Afterward, 200 ml of DMF was added using a syringe, and 1.43 g (10.37 mmol) of potassium carbonate was added under stirring and then the mixture was refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 21 (tetrakis(4'-methylbiphenyl-4-yl)germane) with a yield of 59%.

[Formula 21]

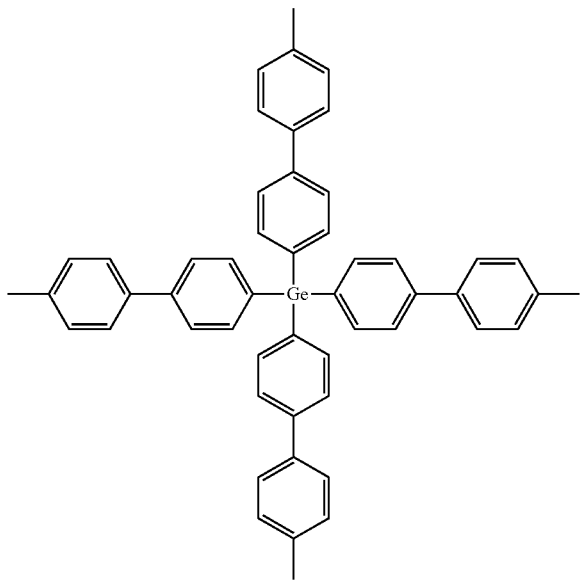

$^1$H-NMR (600 MHz, CDCl$_3$) δ 0.00 (TMS), 2.34 (s, 12H), 7.29-7.33 (m, 16H), 7.51-7.53 (m, 8H), 7.59-7.63 (m, 8H); MALDI-TOF MS m/z=[741.55M$^+$+1]

Example 16

The compound of Formula 19 prepared in Example 13, 4-tert-butylphenylboronic acid and tetrakis(triphenylphosphine)palladium(0) were respectively added to a round bottom flask at 1 g (1.44 mmol), 1.54 g (8.64 mmol) and 0.083 g (0.072 mmol) and deaerated using a vacuum pump for 30 minutes, and then argon gas was injected. Afterward, 200 ml of DMF was added using a syringe, and 1.43 g (10.37 mmol) of potassium carbonate was added under stirring and the mixture was then refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 22 (tetrakis(4'-tert-butylbiphenyl-4-yl)germane) with a yield of 52%.

compound of Formula 23 (tetrakis(4-(naphthalen-1-yl)phenyl)germane) with a yield of 50%.

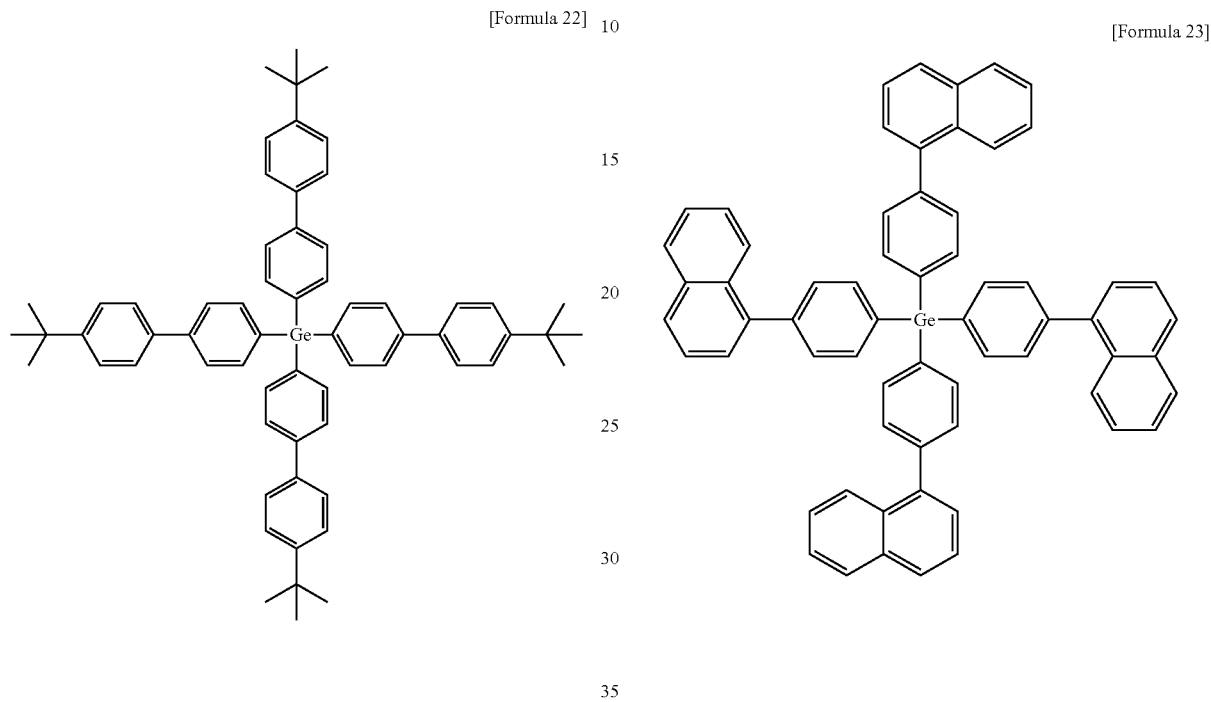

[Formula 22]

[Formula 23]

$^1$H-NMR (600 MHz, CDCl$_3$) δ 0.00 (TMS), 1.35 (s, 36H), 7.33-7.37 (m, 16H), 7.51-7.53 (m, 8H), 7.58-7.61 (m, 8H); MALDI-TOF MS m/z=[909.86 M$^+$+1]

$^1$H-NMR (600 MHz, CDCl$_3$) δ 0.00 (TMS), 7.55-7.61 (m, 20H), 7.71-7.78 (m, 8H), 7.98-8.01 (m, 8H), 8.43-8.48 (m, 8H); MALDI-TOF MS m/z=[885.67 M$^+$+1]

Example 17

The compound of Formula 19 prepared in Example 13, 4-naphthalen-1-ylboronic acid and tetrakis(triphenylphosphine)palladium(0) were respectively added to a round bottom flask at 1 g (1.44 mmol), 1.49 g (8.64 mmol) and 0.083 g (0.072 mmol) and deaerated using a vacuum pump for 30 minutes, and then argon gas was injected. Afterward, 200 ml of DMF was added using a syringe, and 1.43 g (10.37 mmol) of potassium carbonate was added under stirring and the mixture was then refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a white Example 18

The compound of Formula 19 prepared in Example 13, anthracen-9-ylboronic acid and tetrakis(triphenylphosphine)palladium(0) were respectively added to a round bottom flask at 1 g (1.44 mmol), 1.92 g (8.64 mmol) and 0.083 g (0.072 mmol) and deaerated using a vacuum pump for 30 minutes, and then argon gas was injected. Afterward, 200 ml of DMF was added using a syringe, 1.43 g (10.37 mmol) of potassium carbonate was added under stirring and the mixture was then refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 24 (tetrakis(4-(anthracen-9-yl)phenyl)germane) with a yield of 48%.

[Formula 24]

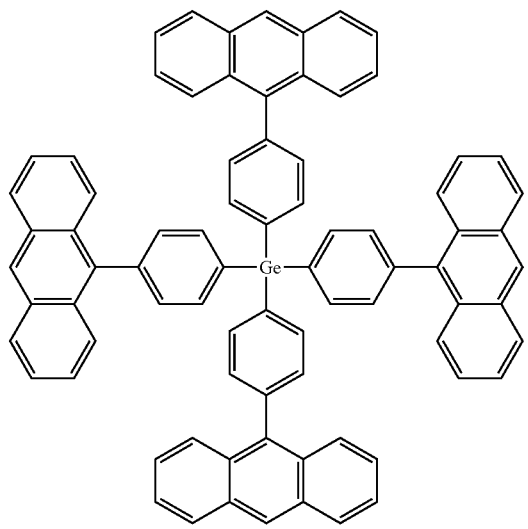

$^1$H-NMR (600 MHz, CDCl$_3$) δ 0.00 (TMS), 7.39-7.51 (m, 24H), 7.79-7.91 (m, 24H), 8.27-8.28 (m, 4H); MALDI-TOF MS m/z=[1085.91 M$^+$+1]

Example 19

Bis(dibenzylideneacetone)palladium(0) and 2,2'-bis(diphenylphosphino)-1,1'-binaphthalene were respectively added to a round bottom flask at 0.025 g (0.043 mmol) and 0.054 g (0.086 mmol) and deaerated using a vacuum pump for 30 minutes, and then argon gas was injected. Afterward, 200 ml of 1,4-dioxane was added using a syringe, then, 1 g (1.44 mmol) of the compound of Formula 19 prepared in Example 13 was added and the resultant mixture was stirred for 40 minutes. And then, diphenylamine and sodium tert-butoxide were respectively added at 1.46 g (8.64 mmol) and 0.83 g (8.64 mmol) and refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a light yellow compound of Formula 25 (4,4',4'',4'''-germanetetrayltetrakis(N,N-diphenylaniline)) with a yield of 66%.

[Formula 25]

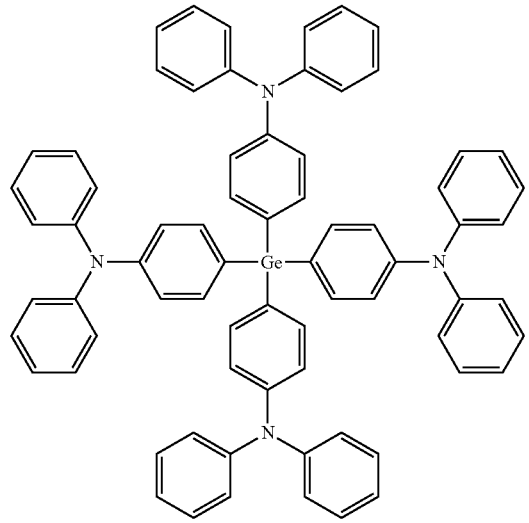

$^1$H-NMR (600 MHz, CDCl$_3$) δ 0.00 (TMS), 6.63-6.67 (m, 24H), 6.79-6.81 (m, 8H), 7.18-7.21 (m, 24H); MALDI-TOF MS m/z=[1049.88 M$^+$+1]

Example 20

Bis(dibenzylideneacetone)palladium(0) and 2,2'-bis(diphenylphosphino)-1,1'-binaphthalene were respectively added to a round bottom flask at 0.025 g (0.043 mmol) and 0.054 g (0.086 mmol) and deaerated using a vacuum pump for 30 minutes, and then argon gas was injected. Afterward, 200 ml of 1,4-dioxane was added using a syringe, then, 1 g (1.44 mmol) of the compound of Formula 19 prepared in Example 13 was added and the resultant mixture was stirred for 40 minutes. And then, 9H-carbazole and sodium tert-butoxide were respectively added at 1.44 g (8.64 mmol) and 0.83 g (8.64 mmol), and the mixture was refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a light yellow compound of Formula 26 (tetrakis (4-(9H-carbazol-9-yl)phenyl)germane) with a yield of 63%.

[Formula 26]

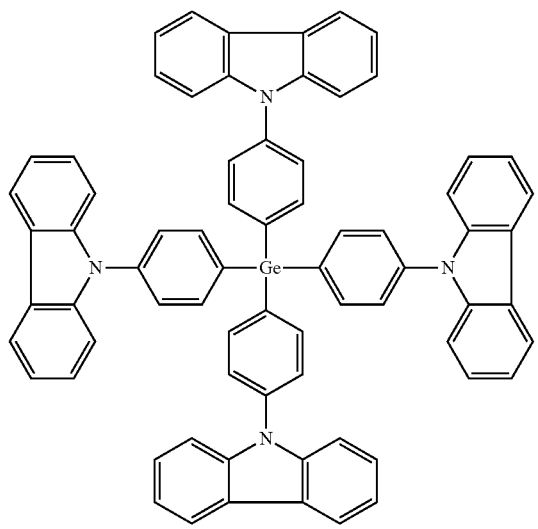

$^1$H-NMR (600 MHz, CDCl$_3$) δ 0.00 (TMS), 7.25-7.33 (m, 12H), 7.44-7.66 (m, 24H), 7.78-7.91 (m, 12H); MALDI-TOF MS m/z=[1041.82 M$^+$+1]

Example 21

12.57 g (523.8 mmol) of Mg was added to a round bottom flask, and 140 ml (0.3 m %) of purified THF was added under an argon atmosphere. Subsequently, 200 g (852 mmol) of 4,4'-dibromobiphenyl dissolved in THF was slowly added using a dropping funnel. The resultant mixture was cooled to room temperature and filtered, thereby obtaining a Grignard reagent. The Grignard reagent was added to a single-neck round bottom flask, and 5 ml (42.7 mmol) of germanium(IV) chloride was injected using a glass syringe under an argon atmosphere, and the resultant mixture was refluxed for 24 hours. After the reaction, the resultant mixture was cooled to room temperature, chloroform and distilled water were added, and an organic layer was washed with distilled water and a saturated NaCl aqueous solution. Subsequently, the organic layer was dehydrated with MgSO$_4$, and distilled under reduced pressure to remove a solvent. Subsequently, column chromatography was performed, thereby obtaining a compound of Formula 27 (tetrakis(4'-bromobiphenyl-4-yl)germane) with a yield of 48%.

[Formula 27]

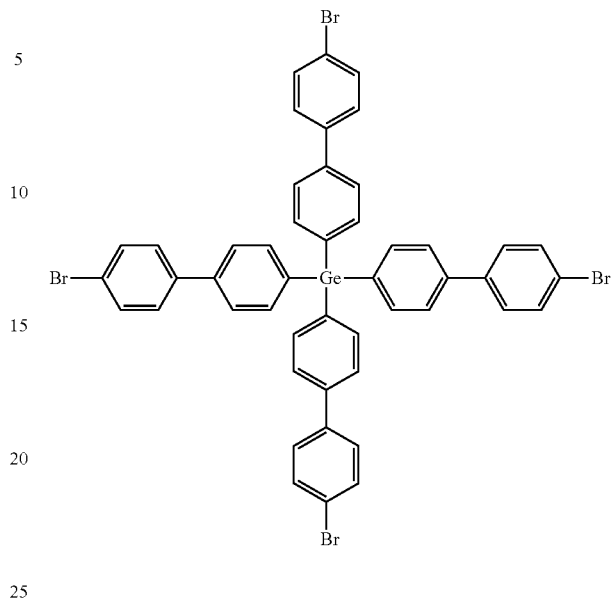

$^1$H-NMR (600 MHz, CDCl$_3$) δ 0.00 (TMS), 7.50-7.53 (m, 16H), 7.65-7.66 (m, 8H), 7.78-7.79 (m, 8H); MALDI-TOF MS m/z=[1001.02 M$^+$+1]

Example 22

The compound of Formula 27 prepared in Example 21, 4-naphthalen-1-ylboronic acid and tetrakis(triphenylphosphine)palladium(0) were respectively added to a round bottom flask at 1 g (1.0 mmol), 1.03 g (6.0 mmol) and 0.058 g (0.05 mmol) and deaerated using a vacuum pump for 30 minutes, and then argon gas was injected. Afterward, 200 ml of DMF was added using a syringe, 0.995 g (7.2 mmol) of potassium carbonate was added under stirring and the mixture was then refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO$_4$, and distilled under reduced pressure to remove a solvent. Subsequently, column chromatography was performed, thereby obtaining a white compound of Formula 28 (tetrakis(4'-(naphthalen-1-yl)biphenyl-4-yl)germane) with a yield of 52%.

[Formula 28]

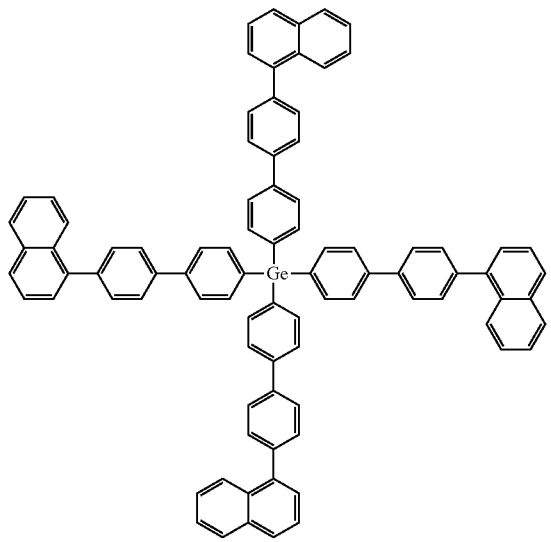

¹H-NMR (600 MHz, CDCl₃) δ 0.00 (TMS), 7.55-7.61 (m, 36H), 7.71-7.78 (m, 8H), 7.98-8.01 (m, 8H), 8.43-8.48 (m, 8H); MALDI-TOF MS m/z=[1190.06 M⁺+1]

Example 23

Bis(dibenzylideneacetone)palladium(0) and 2,2'-bis(diphenylphosphino)-1,1'-binaphthalene were respectively added to a round bottom flask at 0.017 g (0.03 mmol) and 0.037 g (0.06 mmol) and deaerated using a vacuum pump for 30 minutes, and then argon gas was injected. Afterward, 200 ml of 1,4-dioxane was added using a syringe, and then 1 g (1.44 mmol) of the compound of Formula 27 prepared in Example 21 was added and the resultant mixture was stirred for 40 minutes. And then, diphenylamine and sodium tert-butoxide were respectively added at 1.015 g (6.0 mmol) and 0.58 g (6.0 mmol), and the mixture was refluxed for 72 hours. After the reaction, a base used in the reaction was removed with 1% HCl, and the mixture was cooled to room temperature and diluted with chloroform. Subsequently, an organic layer was washed with distilled water and a saturated NaCl aqueous solution, dehydrated with MgSO₄, and distilled under reduced pressure to remove a solvent. Subsequently, column chromatography was performed, thereby obtaining a light yellow compound of Formula 29 (4',4''',4''''-germanetetrayltetrakis(N,N-diphenylbiphenyl-4-amine)) with a yield of 62%.

[Formula 29]

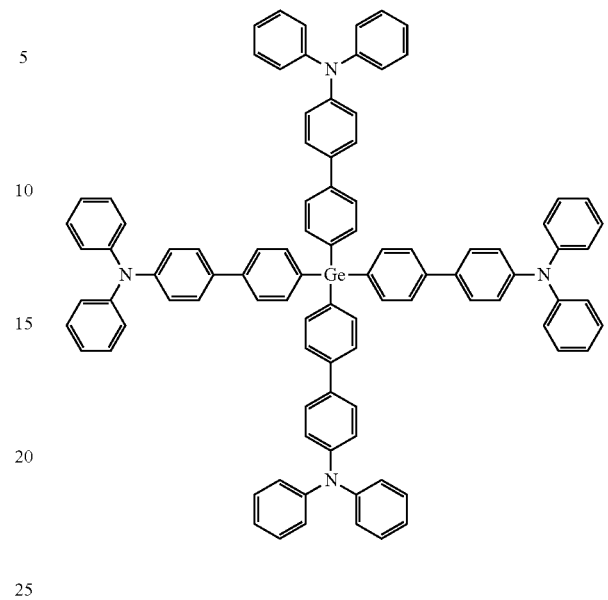

¹H-NMR (600 MHz, CDCl₃) δ 0.00 (TMS), 6.64-6.98 (m, 32H), 7.20-7.24 (m, 16H), 7.56-7.79 (m, 24H); MALDI-TOF MS m/z=[1354.27 M⁺+1]

Example 24

(4'-bromobiphenyl-4-yl)(phenyl)methanone, 2,2-dimethylpropane-1,3-diol and 4-methylbenzenesulfonic acid were respectively added to a round bottom flask at 20 g (60 mmol), 9.37 g (90 mmol) and 0.52 g (3.0 mmol), mixed with 500 ml of toluene, and stirred under reflux at 135° C. for 19 hours. After the reaction, the resultant mixture was extracted with a sodium carbonate aqueous solution, water and chloroform, washed with a saturated NaCl aqueous solution, dehydrated with MgSO₄, and distilled under reduced pressure to remove a solvent. Afterward, the resultant product was recrystallized with isopropanol, thereby obtaining a light pink 2-(4'-bromobiphenyl-4-yl)-5,5-dimethyl-2-phenyl-1,3-dioxane with a yield of 71.8%.

TLC R$_f$=7.06 (n-hexane:THF=3:1); ¹H-NMR (600 MHz, CDCl₃) δ 0.00 (TMS), 0.99 (d, 6H), 3.67-3.72 (m, 4H), 7.36-7.42 (m, 9H), 7.53-7.66 (m, 4H); HRMS m/z=[423.34 M⁺+2]

Afterward, 20.63 g (60 mmol) of 2-(4-bromophenyl)-5, 5-dimethyl-2-phenyl-1,3-dioxane, which was obtained as described above, was added to a round bottom flask 1 and deaerated using a vacuum pump for 30 minutes, and then argon gas was injected. Subsequently, the resultant mixture was dissolved by injecting 50 ml of THF with a syringe. 2.9 g (120 mmol) of fine magnesium powder was added to another round bottom flask 2 and deaerated using a vacuum pump for 30 minutes, and then argon gas was injected. Subsequently, 100 ml of THF was added with a syringe, and the mixture in the round bottom flask 1 was slowly dropped into the mixture of the round bottom flask 2 using a dropping funnel to prepare a Grignard reagent. Residual magnesium of the prepared Grignard reagent was precipitated, and then only a solvent layer was extracted. After deaerated for 30 minutes, the resultant mixture was transferred to an argon gas-injected round bottom flask 3, and 1 ml (8.74 mmol) of germanium chloride was injected using a syringe. The resultant mixture was stirred for 72 hours, cooled to room temperature after the reaction, and diluted with chloroform. An organic layer was washed with a 1% HCl aqueous solution, water and a saturated NaCl aqueous solution, dehydrated with MgSO$_4$, and distilled under reduced pressure to remove the solvent. Afterward, the resultant product was recrystallized with chloroform and n-hexane, thereby obtaining a white compound of Formula 30 (tetrakis(4'-(5,5-dimethyl-2-phenyl-1,3-dioxan-2-yl)biphenyl-4-yl)germane) with a yield of 52%.

solution, dehydrated with MgSO$_4$, and distilled under reduced pressure to remove a solvent. Subsequently, the resultant product was washed with n-hexane and diethyl ether, thereby obtaining a white compound of Formula 31 (4',4''',4''',4''''-germanetetrayltetrakis(biphenyl-4',4-diyl)tetrakis(phenylmethanone)) with a yield of 93%.

[Formula 31]

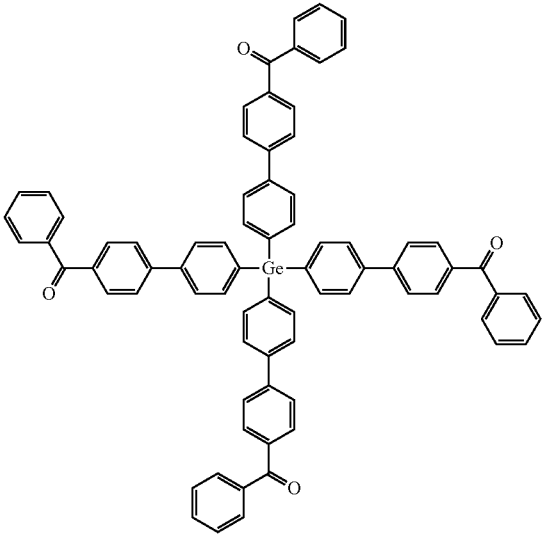

[Formula 30]

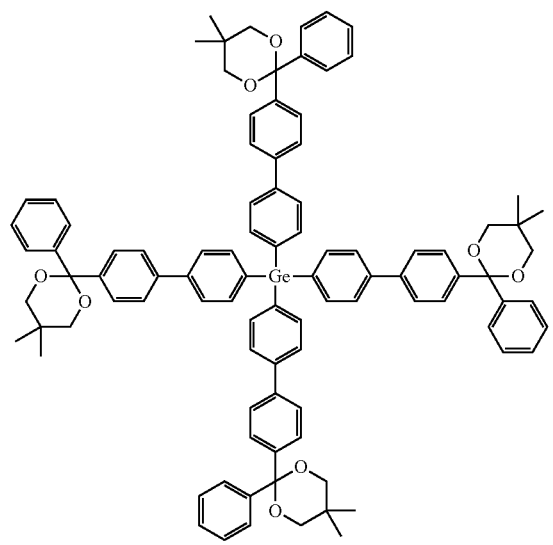

TLC R$_f$=3.00 (n-hexane:THF=3:1); $^1$H-NMR (600 MHz, CDCl$_3$) δ 0.00 (TMS), 7.50-7.64 (m, 20H), 7.74-7.79 (m, 32H); MALDI-TOF MS m/z=[1101.86 M$^+$+1]

Example 26

0.92 g (8.19 mmol) of potassium tert-butoxide was added to a round bottom flask and deaerated using a vacuum pump for 30 minutes, and then argon gas was injected. Afterward, 300 ml of THF was added using a syringe, 1.14 ml (5.46 mmol) of diethylbenzyl phosphonate was added, and the resultant mixture was stirred for 1 hour. Subsequently, 1.0 g (0.91 mmol) of the compound of Formula 31 prepared in Example 25 was added, and the mixture was refluxed for 72 hours. After the reaction, a 1% HCl aqueous solution was added, the resultant mixture was cooled to room temperature and diluted with chloroform. And then, an organic layer was washed with water and a saturated NaCl aqueous solution, dehydrated with MgSO$_4$, and distilled under reduced pressure to remove a solvent. Subsequently, column chromatography was performed, thereby obtaining a white compound of Formula 32 (tetrakis(4'-(1,2-diphenylvinyl)biphenyl-4-yl)germane) with a yield of 79%.

TLC R$_f$=4.41 (n-hexane:THF=3:1); $^1$H-NMR (600 MHz, CDCl$_3$) δ 0.00 (TMS), 0.97 (d, 24H), 3.64 (s, 16H), 7.24-7.38 (m, 20H), 7.53-7.66 (m, 32H); MALDI-TOF MS m/z=[1142.01 M$^+$+1] MALDI-TOF MS m/z=[1446.39 M$^+$+1]

Example 25

3 g (2.074 mmol) of the compound of Formula 30 prepared in Example 24, 0.36 g (2.074 mmol) of 4-methylbenzenesulfonic acid, 150 ml of THF, 150 ml of acetone and 15 ml of DI-water were added to a round bottom flask, and stirred under reflux for 144 hours. After the reaction, the resultant mixture was cooled to room temperature, extracted with methyl chloride, washed with a saturated NaCl aqueous

[Formula 32]

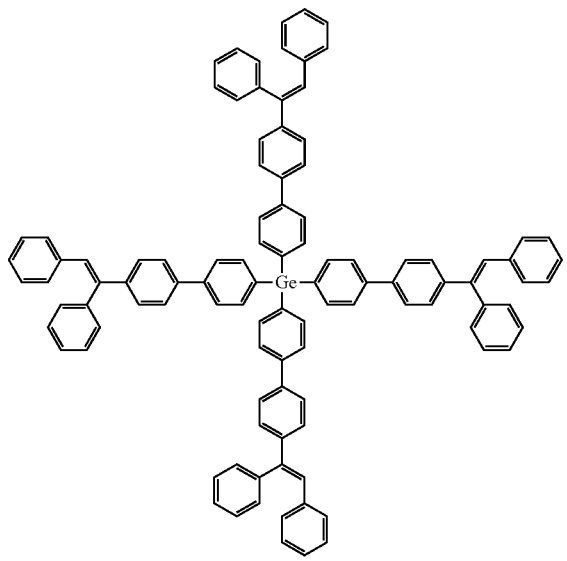

TLC $R_f$=5.30 (n-hexane:THF=3:1); $^1$H-NMR (600 MHz, CDCl$_3$) δ 0.00 (TMS), 7.00-7.02 (m, 12H), 7.08-7.13 (m, 8H), 7.23-7.37 (m, 30H), 7.49-7.55 (m, 18H), 7.64-7.72 (m, 8H); MALDI-TOF MS m/z=[1398.36 M$^+$+1]

Example 27

0.92 g (8.19 mmol) of potassium tert-butoxide was added to a round bottom flask and deaerated using a vacuum pump for 30 minutes, and then argon gas was injected. Afterward, 300 ml of THF was added using a syringe, 1.22 ml (5.46 mmol) of diethyl-4-methylbenzylphosphonate was added, and the resultant mixture was stirred for 1 hour. Subsequently, 1.0 g (0.91 mmol) of the compound of Formula 31 prepared in Example 25 was added, and the mixture was refluxed for 72 hours. After the reaction, a 1% HCl aqueous solution was added, the resultant mixture was cooled to room temperature and diluted with chloroform. And then, an organic layer was washed with water and a saturated NaCl aqueous solution, dehydrated with MgSO$_4$, and distilled under reduced pressure to remove a solvent. Subsequently, column chromatography was performed, thereby obtaining a white compound of Formula 33 (tetrakis(4'-(1-phenyl-2-p-tolylvinyl)biphenyl-4-yl)germane) with a yield of 55%.

[Formula 33]

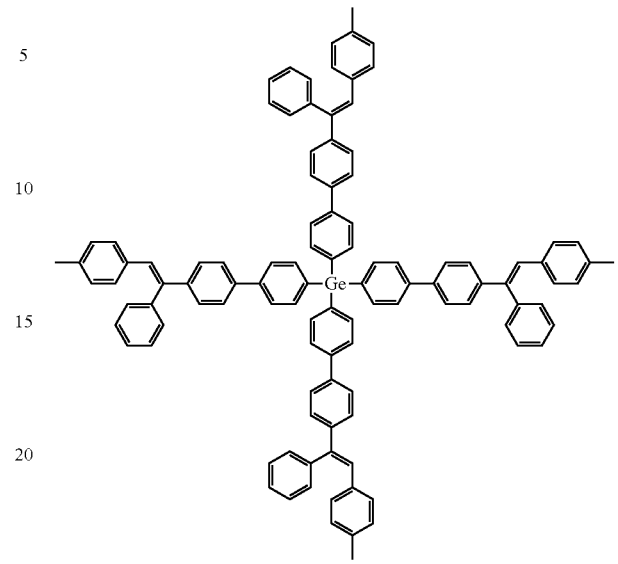

TLC $R_f$=5.97 (n-hexane:THF=3:1); $^1$H-NMR (600 MHz, CDCl$_3$) δ 0.00 (TMS), 2.13-2.22 (m, 12H), 6.91-7.03 (m, 28H), 7.21-7.37 (m, 36H), 7.49-7.59 (m, 8H); MALDI-TOF MS m/z=[1454.46 M$^+$+1]

Example 28

0.92 g (8.19 mmol) of potassium tert-butoxide was added to a round bottom flask and deaerated using a vacuum pump for 30 minutes, and then argon gas was injected. Afterward, 300 ml of THF was added using a syringe, 1.66 g (5.46 mmol) of diethyl biphenyl-4-ylmethylphosphonate was added, and then the resultant mixture was stirred for 1 hour. Afterward, 1.0 g (0.91 mmol) of the compound of Formula 31 prepared in Example 25 was added, and the mixture was refluxed for 72 hours. After the reaction, a 1% HCl aqueous solution was added, and the mixture was cooled to room temperature and diluted with chloroform. Afterward, the resultant mixture was washed with water and a saturated NaCl aqueous solution, dehydrated with MgSO$_4$, and distilled under reduced pressure to remove a solvent. Subsequently, column chromatography was performed, thereby obtaining a white compound of Formula 34 (tetrakis(4'-(2-(biphenyl-4-yl)-1-phenylvinyl)biphenyl-4-yl)germane) with a yield of 47%.

[Formula 34]

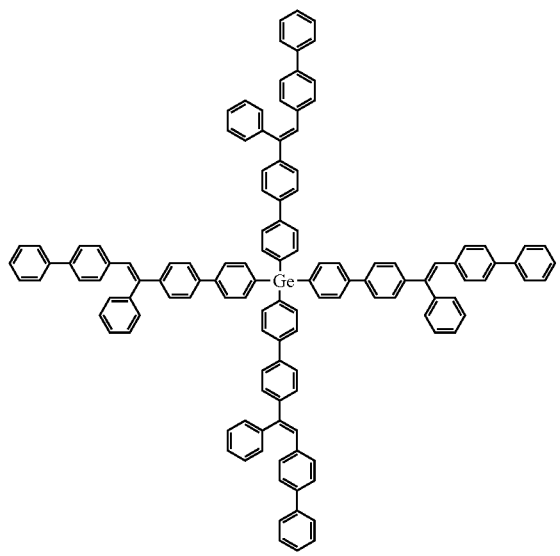

TLC $R_f$=4.01 (n-hexane:THF=3:1); $^1$H-NMR (600 MHz, CDCl$_3$) δ 0.00 (TMS), 6.98-7.09 (m, 12H), 7.27-7.49 (m, 66H), 7.49-7.62 (m, 14H); MALDI-TOF MS m/z=[1702.74 M$^+$+1]

Experimental Example 1

UV absorption and photoluminescence of the compounds prepared in Examples 3 to 7 were measured. The results are shown in Table 1.

TABLE 1

| | UV absorption | photoluminescence | |
|---|---|---|---|
| | Wavelength (nm) | Chromaticity | Wavelength (nm) |
| Formula 9 | 306 | X: 0.1512 Y: 0.0308 | 437 |
| Formula 10 | 310 | X: 0.1440 Y: 0.0673 | 439 |
| Formula 11 | 312 | X: 0.1444 Y: 0.0661 | 436 |
| Formula 12 | 326 | X: 0.1483 Y: 0.1756 | 457 |
| Formula 13 | 309 | X: 0.1413 Y: 0.0848 | 448 |

Experimental Example 2

HOMOs, LUMOs and band gaps of the compounds prepared in Examples 3 to 6 were measured and calculated. The results are shown in Table 2.

TABLE 2

| | HOMO (eV) | LUMO (eV) | Band gap (eV) |
|---|---|---|---|
| Formula 9 | −5.93 | −2.53 | 3.40 |
| Formula 10 | −5.81 | −2.46 | 3.35 |
| Formula 11 | −5.84 | −2.50 | 3.34 |
| Formula 12 | −5.88 | −2.70 | 3.18 |

Preparation Example 1

A glass substrate was prepared, and a first electrode was formed of indium tin oxide (ITO) on the glass substrate. Subsequently, a hole transport layer was formed to a thickness of 60 nm by depositing 4'-bis[N-(1-naphtyl)-N-phenylamino]biphenyl (NPD) on the first electrode. The germanium-centered dendrimer compound of Formula 9 was deposited on the hole transport layer to have a thickness of 40 nm. Afterward, on the light-emitting layer, 2,9-dimethyl-4,7-diphenyl-1,10-phenanthroline (BCP) was deposited to a thickness of 5 nm, tris(8-hydroxyquinoline)aluminum (Alq$_3$) was deposited to a thickness of 20 nm, and then lithium fluoride (LiF) was deposited to a thickness of 1 nm, and a second electrode was formed using a 100 nm-thick aluminum thin film, and therefore an organic light-emitting diode was manufactured. A specific stacked structure of the organic light-emitting diode is shown in FIG. 1. The manufactured organic light-emitting diode required a driving voltage of 6.1 V for light to be passed at 20 mA/cm$^2$, the brightness was 1.10 cd/m$^2$, the efficiency was 0.36 lm/W, and CIE(x,y) was (0.16, 0.11).

Preparation Example 2

A glass substrate was prepared, and a first electrode was formed of indium tin oxide (ITO) on the glass substrate. Subsequently, a hole transport layer was formed to a thickness of 60 nm by depositing 4'-bis[N-(1-naphtyl)-N-phenylamino]biphenyl (NPD) on the first electrode. The germanium-centered dendrimer compound of Formula 10 was deposited on the hole transport layer to have a thickness of 40 nm. Afterward, on the light-emitting layer, 2,9-dimethyl-4,7-diphenyl-1,10-phenanthroline (BCP) was deposited to a thickness of 5 nm, tris(8-hydroxyquinoline)aluminum (Alq$_3$) was deposited to a thickness of 20 nm, and then lithium fluoride (LiF) was deposited to a thickness of 1 nm, and a second electrode was formed using a 100 nm-thick aluminum thin film, and therefore an organic light-emitting diode was manufactured. A specific stacked structure of the organic light-emitting diode is shown in FIG. 1. The manufactured organic light-emitting diode required a driving voltage of 6.2 V for light to be passed at 20 mA/cm$^2$, the brightness was 1.42 cd/m$^2$, the efficiency was 0.51 lm/W, and CIE(x,y) was (0.16, 0.15).

Preparation Example 3

A glass substrate was prepared, and a first electrode was formed of indium tin oxide (ITO) on the glass substrate. Subsequently, a hole transport layer was formed to a thickness of 60 nm by depositing 4'-bis[N-(1-naphtyl)-N-phenylamino]biphenyl (NPD) on the first electrode. The germanium-centered dendrimer compound of Formula 11 was deposited on the hole transport layer to have a thickness of 40 nm. Afterward, on the light-emitting layer, 2,9-dimethyl-4,7-diphenyl-1,10-phenanthroline (BCP) was deposited to a thickness of 5 nm, tris(8-hydroxyquinoline)aluminum (Alq$_3$) was deposited to a thickness of 20 nm, and then lithium fluoride (LiF) was deposited to a thickness of 1 nm, and a second electrode was formed using a 100 nm-thick aluminum thin film, and therefore an organic light-emitting diode was manufactured. A specific stacked structure of the organic light-emitting diode is shown in FIG. 1. The manufactured organic light-emitting diode required a driving voltage of 5.7 V for light to be passed at 20 mA/cm$^2$, the brightness was 1.60 cd/m², the efficiency was 0.58 lm/W, and CIE(x,y) was (0.16, 0.15).

Preparation Example 4

A glass substrate was prepared, and a first electrode was formed of indium tin oxide (ITO) on the glass substrate. Subsequently, a hole transport layer was formed to a thickness of 60 nm by depositing 4'-bis[N-(1-naphtyl)-N-phenyl-amino]biphenyl (NPD) on the first electrode. The germanium-centered dendrimer compound of Formula 12 was deposited on the hole transport layer to have a thickness of 40 nm. Afterward, on the light-emitting layer, 2,9-dimethyl-4,7-diphenyl-1,10-phenanthroline (BCP) was deposited to a thickness of 5 nm, tris(8-hydroxyquinoline)aluminum ($Alq_3$) was deposited to a thickness of 20 nm, and then lithium fluoride (LiF) was deposited to a thickness of 1 nm, and a second electrode was formed using a 100 nm-thick aluminum thin film, and therefore an organic light-emitting diode was manufactured. A specific stacked structure of the organic light-emitting diode is shown in FIG. 1. The manufactured organic light-emitting diode required a driving voltage of 5.6 V for light to be passed at 20 mA/cm², the brightness was 1.78 cd/m², the efficiency was 0.65 lm/W, and CIE(x,y) was (0.16, 0.16).

Preparation Example 5

A glass substrate was prepared, and a first electrode was formed of indium tin oxide (ITO) on the glass substrate. Subsequently, a hole transport layer was formed to a thickness of 60 nm by depositing 4'-bis[N-(1-naphtyl)-N-phenyl-amino]biphenyl (NPD) on the first electrode. A light-emitting layer including N,N'-dicarbazolyl-3,5-benzene (MCP) as a host material and the germanium-centered dendrimer compound of Formula 17 as a dopant material was deposited on the hole transport layer to have a thickness of 40 nm. Afterward, on the light-emitting layer, 2,9-dimethyl-4,7-diphenyl-1,10-phenanthroline (BCP) was deposited to a thickness of 5 nm, tris(8-hydroxyquinoline)aluminum ($Alq_3$) was deposited to a thickness of 20 nm, and then lithium fluoride (LiF) was deposited to a thickness of 1 nm, and a second electrode was formed using a 100 nm-thick aluminum thin film, and therefore an organic light-emitting diode was manufactured. A specific stacked structure of the organic light-emitting diode is shown in FIG. 1. The manufactured organic light-emitting diode required a driving voltage of 5.7 V for light to be passed at 20 mA/cm², the brightness was 2.3 cd/m², the efficiency was 0.82 lm/W, and CIE(x,y) was (0.15, 0.12).

Preparation Example 6

A glass substrate was prepared, and a first electrode was formed of indium tin oxide (ITO) on the glass substrate. Subsequently, a hole transport layer was formed to a thickness of 60 nm by depositing 4'-bis[N-(1-naphtyl)-N-phenyl-amino]biphenyl (NPD) on the first electrode. The germanium-centered dendrimer compound of Formula 24 was deposited on the hole transport layer to have a thickness of 40 nm. Afterward, on the light-emitting layer, 2,9-dimethyl-4,7-diphenyl-1,10-phenanthroline (BCP) was deposited to a thickness of 5 nm, tris(8-hydroxyquinoline)aluminum ($Alq_3$) was deposited to a thickness of 20 nm, and then lithium fluoride (LiF) was deposited to a thickness of 1 nm, and a second electrode was formed using a 100 nm-thick aluminum thin film, and therefore an organic light-emitting diode was manufactured. A specific stacked structure of the organic light-emitting diode is shown in FIG. 1. The manufactured organic light-emitting diode required a driving voltage of 5.8 V for light to be passed at 20 mA/cm², the brightness was 1.24 cd/m², the efficiency was 0.48 lm/W, and CIE(x,y) was (0.15, 0.13).

INDUSTRIAL APPLICABILIT

The germanium-centered dendrimer compound according to the present invention can be used in an optoelectronic device.

As described above, the exemplary embodiments of the present application have been described in detail. Therefore, it will be clearly understood by those of ordinary skill in the art that the detailed descriptions are merely exemplary embodiments, and the scope of the present application is not limited thereto. Accordingly, the actual range of the present application will be defined by the accompanying claims and equivalents thereof.

What is claimed is:

1. A germanium-centered dendrimer compound having the following structure of Formula 1:

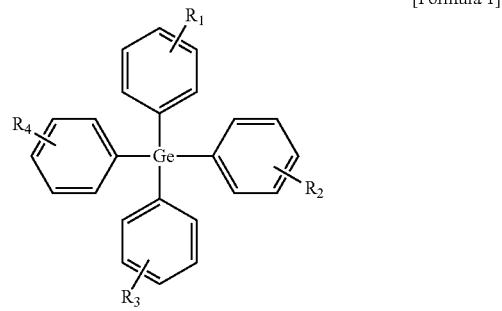

[Formula 1]

wherein:

$R_1$, $R_2$, $R_3$ and $R_4$ are each independently attached at the respective para position and represented by Formula 5:

[Formula 5]

$R_5$ is hydrogen, $R_6$ is an aryl group having to 20 carbon atoms or a heteroaryl group having 2 to 20 carbon atoms, $R_7$ is an alkyl group having 1 to 10 carbon atoms, an aryl group having 6 to 20 carbon atoms or a heteroaryl group having 2 to 20 carbon atoms, and one or more hydrogens in $R_1$ to $R_4$ and $R_6$ to $R_7$ are each independently a compound substituted or not substituted with one or more substituents selected from the group consisting of an alkyl group having 1 to 20 carbon atoms, an alkoxy group having 1 to 20 carbon atoms, an aryl group having 6 to 30 carbon atoms, a heteroaryl group having 2 to 30 carbon atoms, a heterocyclic group having 3 to 30 carbon atoms, an acyl group having 1 to 30 carbon atoms, an acyloxy group having 6 to 30 carbon atoms, a dialkylamino group having 2 to 30 carbon atoms, a diarylamino group having 12 to 30 carbon atoms, an alkylarylamino group having 7 to 30 carbon atoms, a dialkylphosphino group having 2 to 30 carbon atoms, a diarylphosphino group having 12 to 30 carbon atoms, an alkylarylphosphino group having 7 to 30 carbon atoms, an amine group, a halogen group, a cyano group, a nitro group, a hydroxyl group and a carboxyl group.

2. The compound of claim 1, wherein
the compound of Formula 1 is a germanium-centered symmetrical structure.

3. The compound of claim 1, wherein the compound of Formula 1 is one or more selected from the group consisting of Formulae 12 and 14 to 18:

[Formula 12]

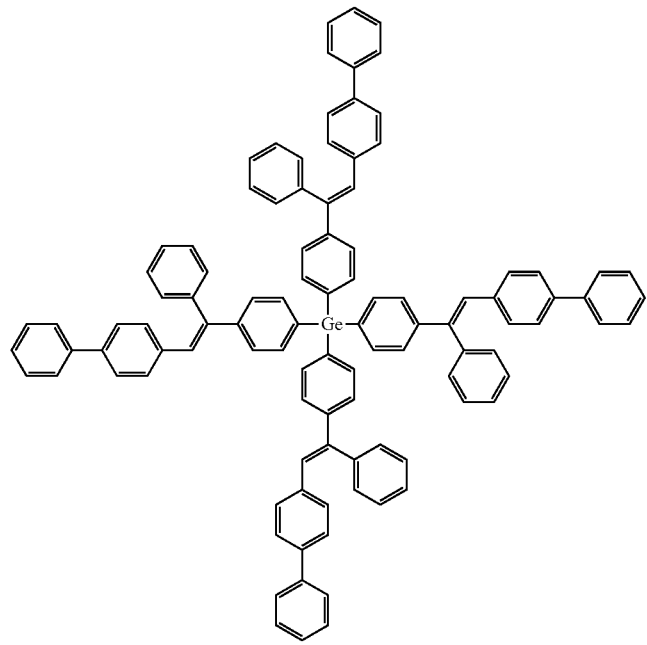

[Formula 14]

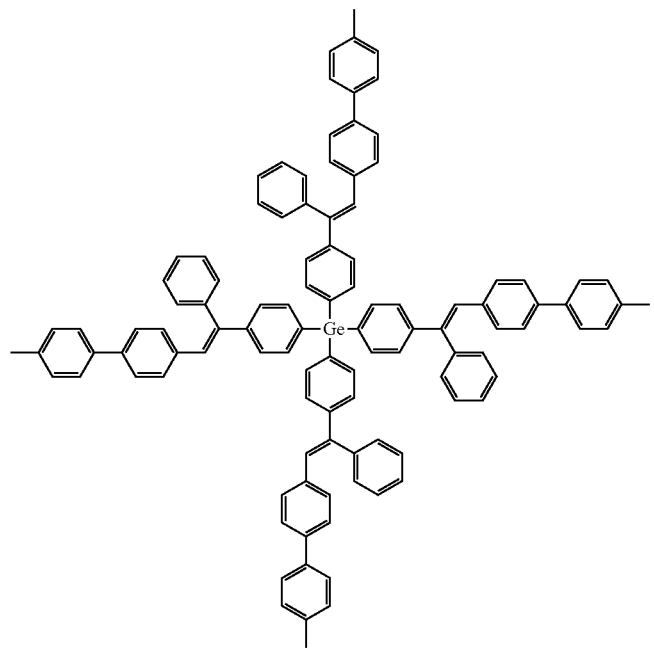

[Formula 15]
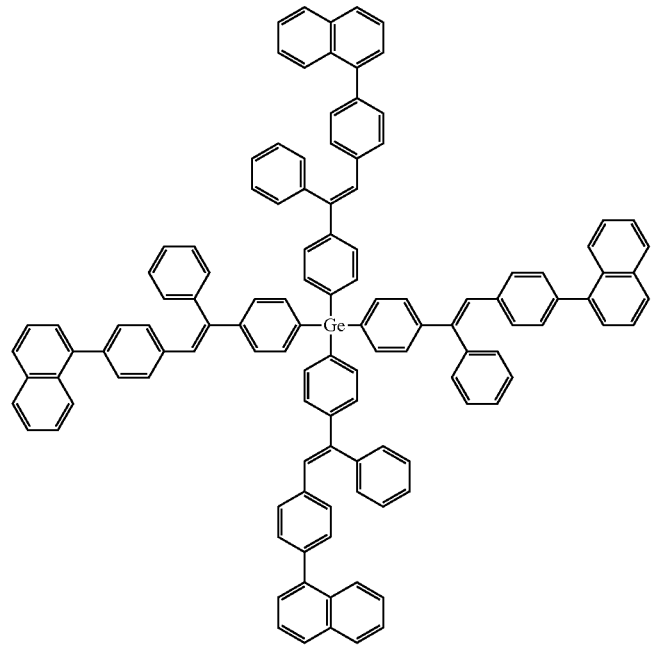
[Formula 16]
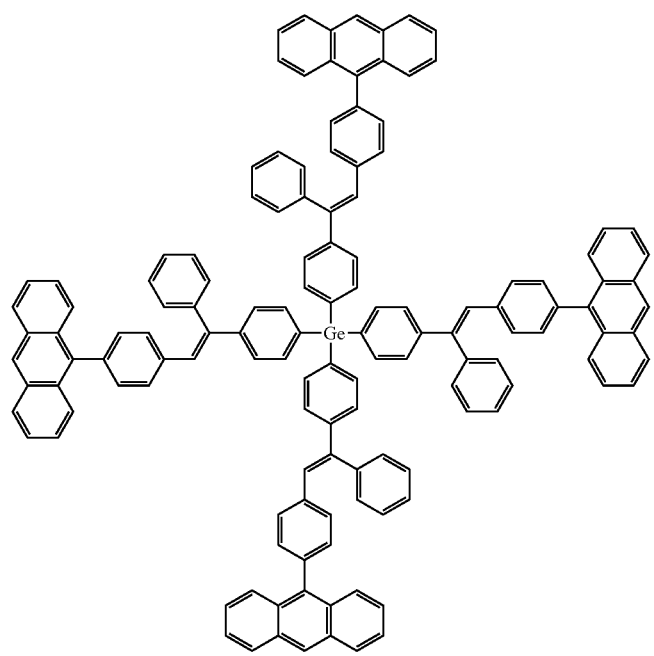

[Formula 17]

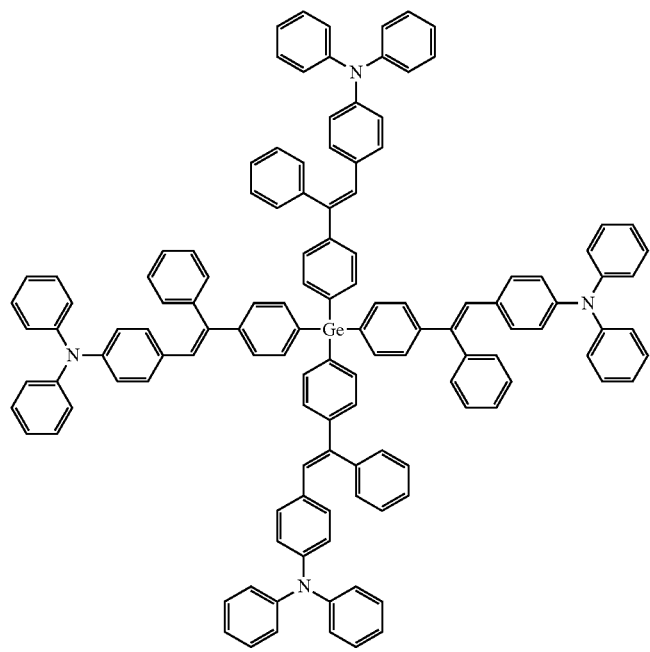

[Formula 18]

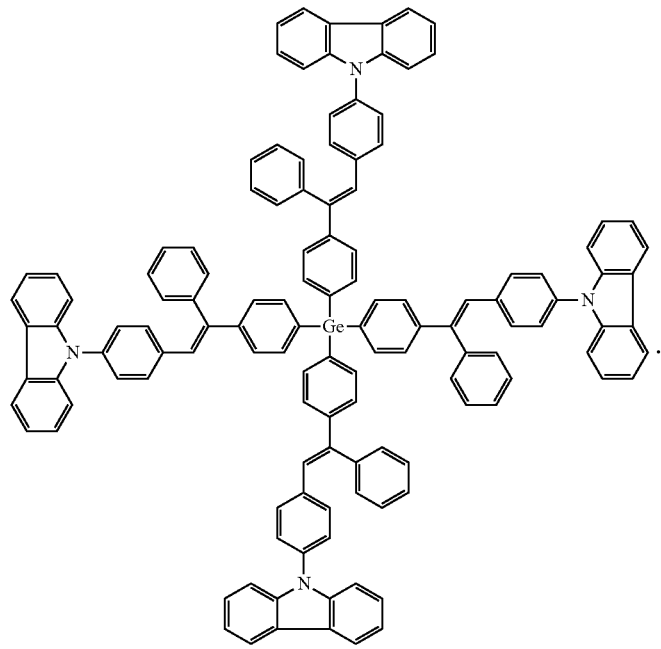

4. An optoelectronic device comprising the compound of claim 1.

5. The device of claim 4, wherein the optoelectronic device is an organic light-emitting device, an organic solar cell or an organic semiconductor.

6. The device of claim 4, wherein the optoelectronic device is an organic light-emitting device, which comprises a first electrode, an organic layer and a second electrode, wherein the organic layer includes one or more of a hole transport layer, a light-emitting layer, a hole blocking layer, an electron transport layer and an electron injection layer, and one or more of the layers constituting the organic layer includes said compound.

* * * * *